US008023341B2

(12) United States Patent
Kawabata et al.

(10) Patent No.: US 8,023,341 B2
(45) Date of Patent: Sep. 20, 2011

(54) METHOD AND APPARATUS FOR ADDRESS ALLOTTING AND VERIFICATION IN A SEMICONDUCTOR DEVICE

(75) Inventors: Shozo Kawabata, Aichi-Ken (JP); Kenji Shibata, Aichi-ken (JP); Takaaki Furuyama, Aichi-ken (JP); Satoru Kawamoto, Aichi-ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/903,065

(22) Filed: Oct. 12, 2010

(65) Prior Publication Data
US 2011/0026287 A1 Feb. 3, 2011

Related U.S. Application Data

(62) Division of application No. 12/199,684, filed on Aug. 27, 2008, now Pat. No. 7,813,154.

(51) Int. Cl.
*G11C 7/10* (2006.01)

(52) U.S. Cl. .............. 365/189.08; 365/189.09; 365/194; 365/49.1

(58) Field of Classification Search ............ 365/189.08, 365/189.09, 194, 49.1
See application file for complete search history.

(56) References Cited

U.S. PATENT DOCUMENTS

| 5,657,270 A | 8/1997 | Ohuchi et al. |
| 5,873,122 A | 2/1999 | Nishii et al. |
| 6,052,313 A * | 4/2000 | Atsumi et al. ........... 365/189.05 |
| 6,088,281 A | 7/2000 | Miyakawa et al. |
| 6,118,703 A | 9/2000 | Hamaguchi |
| 6,222,779 B1 | 4/2001 | Saito et al. |
| 6,240,040 B1 | 5/2001 | Akaogi et al. |
| 6,314,048 B1 | 11/2001 | Ishikawa |
| 6,339,549 B1 | 1/2002 | Jinbo et al. |
| 6,629,224 B1 * | 9/2003 | Suzuki et al. ................ 711/167 |
| 6,813,184 B2 | 11/2004 | Lee |
| 7,227,778 B2 | 6/2007 | Yamada |
| 7,230,852 B2 | 6/2007 | Mitani et al. |
| 7,263,023 B2 | 8/2007 | Suh |
| 7,421,636 B2 | 9/2008 | Kang et al. |
| 2008/0181008 A1 * | 7/2008 | Lee et al. ................ 365/185.17 |

FOREIGN PATENT DOCUMENTS

| JP | 3295098 A | 12/1991 |
| JP | 6076586 A | 3/1994 |
| JP | 6131886 A | 5/1994 |
| JP | 6349285 A | 12/1994 |
| JP | 10106275 A | 4/1998 |
| JP | 10214489 A | 8/1998 |
| JP | 11126489 A | 5/1999 |
| JP | 11306770 A | 11/1999 |
| JP | 2000235797 A | 8/2000 |
| JP | 2003157680 A | 5/2003 |
| JP | 2003187599 A | 7/2003 |
| WO | 0161503 A1 | 8/2001 |

* cited by examiner

*Primary Examiner* — Richard Elms
*Assistant Examiner* — Hien Nguyen

(57) ABSTRACT

A semiconductor device includes a CAM cell array that stores the operation setting information as to the semiconductor device, a controller that controls read and write of the CAM cell array, a row decoder, and a column decoder. With this structure, different row addresses are allocated to respective functions of the operation setting information. Accordingly, stress is not caused in the CAM cell array of the unselected functions at the time of programming.

12 Claims, 20 Drawing Sheets

| Row | Column (A21-26) | | | | | | DQ(A17-20) | | | | | | | | | | | | | | | | Content |
|---|---|---|---|---|---|---|---|---|---|---|---|---|---|---|---|---|---|---|---|---|---|---|---|
| | 5 | 4 | 3 | 2 | 1 | 0 | 0 | 1 | 2 | 3 | 4 | 5 | 6 | 7 | 8 | 9 | A | B | C | D | E | F | |
| 0 | 0 | 0 | 0 | 0 | 0 | 0 | 0 | 1 | 2 | 3 | 4 | 5 | 6 | 7 | 8 | 9 | 10 | 11 | 12 | 13 | 14 | 15 | WP A22-17=000000~001111 |
| 0 | 0 | 0 | 0 | 0 | 0 | 1 | 16 | 17 | 18 | 19 | 20 | 21 | 22 | 23 | 24 | 25 | 26 | 27 | 28 | 29 | 30 | 31 | WP A22-17=010000~011111 |
| 0 | 0 | 0 | 0 | 0 | 1 | 0 | 32 | 33 | 34 | 35 | 36 | 37 | 38 | 39 | 40 | 41 | 42 | 43 | 44 | 45 | 46 | 47 | WP A22-17=100000~101111 |
| 0 | 0 | 0 | 0 | 0 | 1 | 1 | 48 | 49 | 50 | 51 | 52 | 53 | 54 | 55 | 56 | 57 | 58 | 59 | 60 | 61 | 62 | 63 | WP A22-17=110000~111111 |
| 1 | 0 | 0 | 0 | 0 | 0 | 0 | TR0 | TR1 | TR2 | TR3 | TR4 | TR5 | TR6 | TR7 | TR8 | TR9 | TR10 | TR11 | TR12 | TR13 | TR14 | TR15 | 16 bits for trimming |
| 1 | 0 | 0 | 0 | 0 | 0 | 1 | RED SEC A | | | | | | | | RED SEC B | | | | | | | | Sector Redundancy 4 defects |
| 1 | 0 | 0 | 0 | 0 | 1 | 0 | RED SEC C | | | | | | | | RED SEC D | | | | | | | | |
| 1 | 0 | 0 | 0 | 0 | 1 | 1 | RED COL0-0 | | | | | | | | RED COL0-1 | | | | | | | | Column Redundancy 16 defects |
| 1 | 0 | 0 | 0 | 1 | 0 | 0 | RED COL1-0 | | | | | | | | RED COL1-1 | | | | | | | | |
| 1 | 0 | 0 | 0 | 1 | 0 | 1 | RED COL2-0 | | | | | | | | RED COL2-1 | | | | | | | | |
| 1 | 0 | 0 | 0 | 1 | 1 | 0 | RED COL3-0 | | | | | | | | RED COL3-1 | | | | | | | | |
| 1 | 0 | 0 | 0 | 1 | 1 | 1 | RED COL4-0 | | | | | | | | RED COL4-1 | | | | | | | | |
| 1 | 0 | 0 | 1 | 0 | 0 | 0 | RED COL5-0 | | | | | | | | RED COL5-1 | | | | | | | | |
| 1 | 0 | 0 | 1 | 0 | 0 | 1 | RED COL6-0 | | | | | | | | RED COL6-1 | | | | | | | | |
| 1 | 0 | 0 | 1 | 0 | 1 | 0 | RED COL7-0 | | | | | | | | RED COL7-1 | | | | | | | | |

User Block / Factory Block

FIG. 3

| Row | Column | | | DQ | | | | | | | | | | | | | | | |
|---|---|---|---|---|---|---|---|---|---|---|---|---|---|---|---|---|---|---|---|
| | 2 | 1 | 0 | 0 | 1 | 2 | 3 | 4 | 5 | 6 | 7 | 8 | 9 | A | B | C | D | E | F |
| 0 | 0 | 0 | 0 | u0 | u1 | u2 | u3 | u4 | u5 | u6 | u7 | u8 | u9 | u10 | u11 | u12 | u13 | u14 | u15 |
| 0 | 0 | 0 | 1 | u16 | u17 | u18 | u19 | u20 | u21 | u22 | u23 | u24 | u25 | u26 | u27 | u28 | u29 | u30 | u31 |
| 0 | 0 | 1 | 0 | u32 | u33 | u34 | u35 | u36 | u37 | u38 | u39 | u40 | u41 | u42 | u43 | u44 | u45 | u46 | u47 |
| 0 | 0 | 1 | 1 | u48 | u49 | u50 | u51 | u52 | u53 | u54 | u55 | u56 | u57 | u58 | u59 | u60 | u61 | u62 | u63 |
| 1 | 0 | 0 | 0 | f0 | f1 | f2 | f3 | f4 | f5 | f6 | f7 | f8 | f9 | f10 | f11 | f12 | f13 | f14 | f15 |
| 1 | 0 | 0 | 1 | f16 | f17 | f18 | f19 | f20 | f21 | f22 | f23 | f24 | f25 | f26 | f27 | f28 | f29 | f30 | f31 |
| 1 | 0 | 1 | 0 | f32 | f33 | f34 | f35 | f36 | f37 | f38 | f39 | f40 | f41 | f42 | f43 | f44 | f45 | f46 | f47 |
| 1 | 0 | 1 | 1 | f48 | f49 | f50 | f51 | f52 | f53 | f54 | f55 | f56 | f57 | f58 | f59 | f60 | f61 | f62 | f63 |

User Block / Factory Block

FIG. 4

| WP Bit Number | WP Address | | | | | |
|---|---|---|---|---|---|---|
| | A22 | A21 | A20 | A19 | A18 | A17 |
| 0 | 0 | 0 | 0 | 0 | 0 | 0 |
| 1 | 0 | 0 | 0 | 0 | 0 | 1 |
| 2 | 0 | 0 | 0 | 0 | 1 | 0 |
| 3 | 0 | 0 | 0 | 0 | 1 | 1 |
| 4 | 0 | 0 | 0 | 1 | 0 | 0 |
| 5 | 0 | 0 | 0 | 1 | 0 | 1 |
| 6 | 0 | 0 | 0 | 1 | 1 | 0 |
| 7 | 0 | 0 | 0 | 1 | 1 | 1 |
| 8 | 0 | 0 | 1 | 0 | 0 | 0 |
| 9 | 0 | 0 | 1 | 0 | 0 | 1 |
| 10 | 0 | 0 | 1 | 0 | 1 | 0 |
| 11 | 0 | 0 | 1 | 0 | 1 | 1 |
| 12 | 0 | 0 | 1 | 1 | 0 | 0 |
| 13 | 0 | 0 | 1 | 1 | 0 | 1 |
| 14 | 0 | 0 | 1 | 1 | 1 | 0 |
| 15 | 0 | 0 | 1 | 1 | 1 | 1 |
| 16 | 0 | 1 | 0 | 0 | 0 | 0 |
| 17 | 0 | 1 | 0 | 0 | 0 | 1 |
| 18 | 0 | 1 | 0 | 0 | 1 | 0 |
| 19 | 0 | 1 | 0 | 0 | 1 | 1 |
| 20 | 0 | 1 | 0 | 1 | 0 | 0 |
| 21 | 0 | 1 | 0 | 1 | 0 | 1 |
| 22 | 0 | 1 | 0 | 1 | 1 | 0 |
| 23 | 0 | 1 | 0 | 1 | 1 | 1 |
| 24 | 0 | 1 | 1 | 0 | 0 | 0 |
| 25 | 0 | 1 | 1 | 0 | 0 | 1 |
| 26 | 0 | 1 | 1 | 0 | 1 | 0 |
| 27 | 0 | 1 | 1 | 0 | 1 | 1 |
| 28 | 0 | 1 | 1 | 1 | 0 | 0 |
| 29 | 0 | 1 | 1 | 1 | 0 | 1 |
| 30 | 0 | 1 | 1 | 1 | 1 | 0 |
| 31 | 0 | 1 | 1 | 1 | 1 | 1 |

| WP Bit Number | WP Address | | | | | |
|---|---|---|---|---|---|---|
| | A22 | A21 | A20 | A19 | A18 | A17 |
| 32 | 1 | 0 | 0 | 0 | 0 | 0 |
| 33 | 1 | 0 | 0 | 0 | 0 | 1 |
| 34 | 1 | 0 | 0 | 0 | 1 | 0 |
| 35 | 1 | 0 | 0 | 0 | 1 | 1 |
| 36 | 1 | 0 | 0 | 1 | 0 | 0 |
| 37 | 1 | 0 | 0 | 1 | 0 | 1 |
| 38 | 1 | 0 | 0 | 1 | 1 | 0 |
| 39 | 1 | 0 | 0 | 1 | 1 | 1 |
| 40 | 1 | 0 | 1 | 0 | 0 | 0 |
| 41 | 1 | 0 | 1 | 0 | 0 | 1 |
| 42 | 1 | 0 | 1 | 0 | 1 | 0 |
| 43 | 1 | 0 | 1 | 0 | 1 | 1 |
| 44 | 1 | 0 | 1 | 1 | 0 | 0 |
| 45 | 1 | 0 | 1 | 1 | 0 | 1 |
| 46 | 1 | 0 | 1 | 1 | 1 | 0 |
| 47 | 1 | 0 | 1 | 1 | 1 | 1 |
| 48 | 1 | 1 | 0 | 0 | 0 | 0 |
| 49 | 1 | 1 | 0 | 0 | 0 | 1 |
| 50 | 1 | 1 | 0 | 0 | 1 | 0 |
| 51 | 1 | 1 | 0 | 0 | 1 | 1 |
| 52 | 1 | 1 | 0 | 1 | 0 | 0 |
| 53 | 1 | 1 | 0 | 1 | 0 | 1 |
| 54 | 1 | 1 | 0 | 1 | 1 | 0 |
| 55 | 1 | 1 | 0 | 1 | 1 | 1 |
| 56 | 1 | 1 | 1 | 0 | 0 | 0 |
| 57 | 1 | 1 | 1 | 0 | 0 | 1 |
| 58 | 1 | 1 | 1 | 0 | 1 | 0 |
| 59 | 1 | 1 | 1 | 0 | 1 | 1 |
| 60 | 1 | 1 | 1 | 1 | 0 | 0 |
| 61 | 1 | 1 | 1 | 1 | 0 | 1 |
| 62 | 1 | 1 | 1 | 1 | 1 | 0 |
| 63 | 1 | 1 | 1 | 1 | 1 | 1 |

*FIG. 5*

| WP ADDRESS | A22 | A21 | A20 | A19 | A18 | A17 |
|---|---|---|---|---|---|---|
| CAM ADDRESS | COLUMN 1 | COLUMN 0 | DQ15-0 ||||
FIG. 6
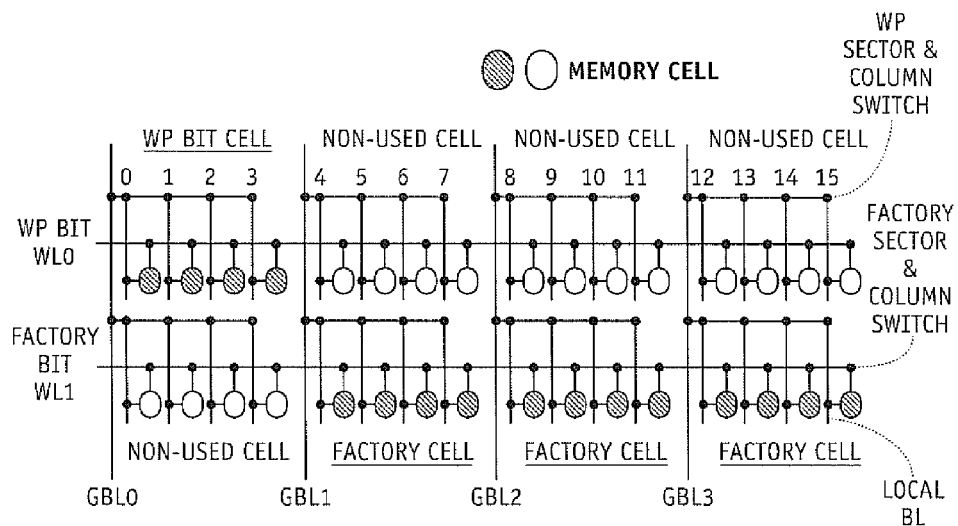
FIG. 7A
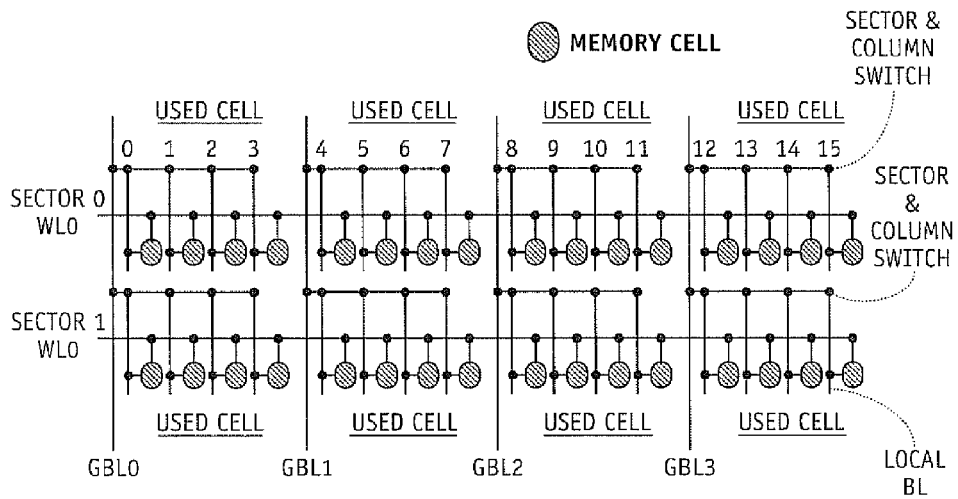
FIG. 7B

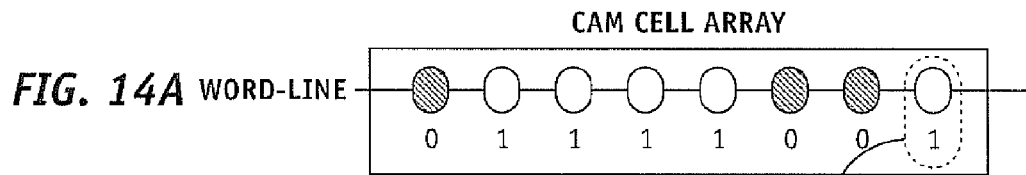
FIG. 14A
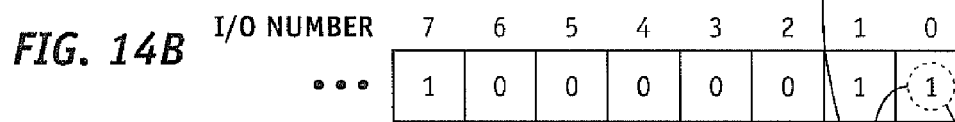
FIG. 14B
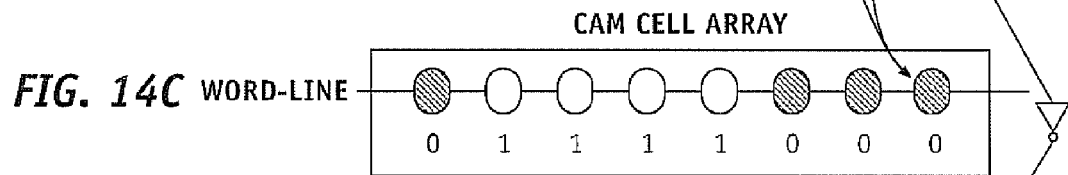
FIG. 14C
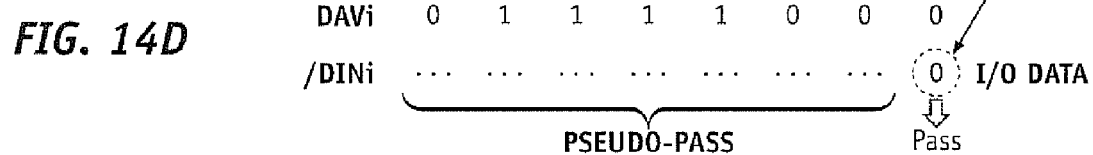
FIG. 14D
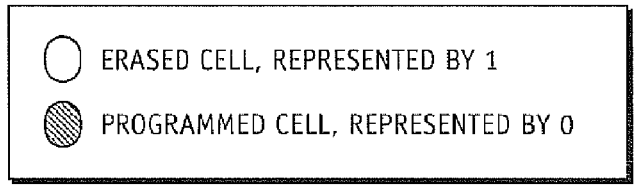

METHOD AND APPARATUS FOR ADDRESS ALLOTTING AND VERIFICATION IN A SEMICONDUCTOR DEVICE

CROSS-REFERENCES TO RELATED APPLICATIONS

This application is a divisional of U.S. patent application Ser. No. 12/199,684, filed on Aug. 27, 2008, entitled "Method and Apparatus for Address Allotting and Verification in A Semiconductor Device," which is a continuation of International Application number PCT/JP2005/001083 filed Jan. 27, 2005, these applications are hereby incorporated herein by reference in their entirety.

BACKGROUND OF THE INVENTION

1. Field of the Invention

The present invention generally relates to semiconductor devices, and more particularly, to a semiconductor device that includes a non-volatile memory. Even more specifically, the present invention relates to a technique of controlling the operation of a semiconductor device using CAM (Content Addressable Memory) data.

2. Description of the Related Art

Conventionally, two types of non-volatile memory semiconductor devices are well known: one has a structure that determines whether the data stored in a non-volatile memory is equivalent to expected value data so as to automatically perform data checking at the time of programming or erasing a non-volatile memory and the other one has a structure that has regular non-volatile memory cells to be used by users and CAM cells to control the operation of the semiconductor device. In recent years, so as to reduce the device size, a structure that has CAM cells formed with regular non-volatile memory cells has been proposed. If the CAM cells have the same structures as the regular memory cells, the word lines and the bit lines to be connected to the CAM cells should preferably have the same structure as those to be connected to the regular memory cells.

The CAM data that is written in CAM cells having the same structures as regular memory cells is preferably read out and transferred to a volatile memory unit (a latch circuit) such as a SRAM (Static Random Access Memory) at the time of power on or resetting of the hardware. By doing so, the operating speed at the time of read-access to the regular non-volatile memory cells is not reduced by CAM data reading.

If the CAM cells have the same structure as the regular memory cells, the verifying operation of the CAM cells should preferably be completed within the memory device at the time of rewriting the CAM data, like the verifying operation of the regular memory cells. Japanese Unexamined Patent Publication No. 6-76586 discloses a verification circuit for programming regular memory cells.

When regular memory cells are to be programmed, the information "1" or "0" is input through I/Os by a user. A memory cell having the information "0" input thereto is a memory cell to be programmed, and a memory cell having the information "1" input thereto is a memory cell to be erased. The information of each I/O is used as an expected value at the time of verification.

In a semiconductor device, prior to actual programming, the data is read out from the memory cell connected to the word lines to be programmed. This process is referred to as "pre-reading". The pre-read data is compared with the data input through the I/Os. According to the comparison results, programming is performed only on the memory cells that are in the erased state (holding the information "1") and are to be programmed through the I/Os (having the information "0" input thereto).

Programming is not performed on the already programmed memory cells (holding the information "0"), because additional programming results in stress. If the information that is input to the already programmed memory cells (holding the information "0") through the I/Os is "1", an error signal is returned to the controller. This is because the memory cells are non-volatile memories that physically perform writing operations, and have non-volatility. Therefore, an erasing operation is independent of a programming operation, and erasing is collectively performed on one sector. If the information that is input through the I/Os to the already erased memory cells (holding the information "1") is "1", no operations are performed.

Programming of CAM cells should preferably be performed in the same manner as the programming of regular memory cells. For programming CAM cells, there is a method that involves two different interfaces from the programming interface for regular memory cells. Input setting is performed in accordance with the information "1" and the information "0" input through the I/Os so as to determine CAM cells to be programmed and CAM cells not to be programmed (see Japanese Unexamined Patent Publication No. 10-106275). The programming interface for the input setting is referred to as "interface 1". In the case of interface 1, a user inputs the information "1" and the information "0" through the respective I/Os. The information "1" indicates a memory cell to be programmed, while the information "0" indicates a memory cell for which no operation is to be performed (i.e., not to be programmed).

For programming CAM cells, there is not only the method involving interface 1, but also a method of designating only the CAM cells to be programmed through command input. The programming interface used in this method is referred to as "interface 2". In the case of using interface 2, the addresses of CAM cells are designated, and the address-designated CAM cells are to be programmed.

Each CAM cell should preferably have a user block in which users can rewrite information and a factory block in which the vender maker writes information in advance. If the CAM data in the user block are rewritten in this structure, it is necessary to protect the memory cells in the factory block from disturb caused by cell information. "Disturb" is a phenomenon in which charge loss or charge gain occurs in memory cells due to electric influence from the word lines and bit lines to which the memory cells are connected at the time of programming the designated memory cells.

In a case where the CAM data in the user block is to be rewritten, it is necessary to protect the memory cells in the factory block from disturb caused by the cell information. However, there is not a conventional technique for satisfying this requirement, which is the first problem with the prior art.

The second problem with the prior art is that proper verification cannot be performed after programming CAM cells. The following is a description of this problem.

This second problem is caused when a verifying operation is performed simultaneously on CAM cells coupled to the same word line in an array structure which has more than one CAM cell connected to a word line.

FIG. 1A illustrates CAM cells that are connected to one word line and are in a programmed state. The CAM cells of "1" in FIG. 1A are erased cells and have not been programmed. The CAM cells of "0" are programmed cells and have already been programmed.

In FIG. 1B, I/O input by interface 1 is performed on the CAM cells on the word line shown in FIG. 1A. Here, the CAM cells with "1" are to be programmed, and the cells with "0" are not to be programmed and remain in the current state.

In the semiconductor device, the data that is pre-read from CAM cells on the same word line are compared with the data that is input through the I/Os. According to the comparison results, programming is performed only on the CAM cell that is in the erased state (with the information "1" being stored) and is to be I/O-programmed (with the information "1" being input). In this example, programming is performed on the rightmost CAM cell on the word line, as shown in FIG. 1C.

Verification is performed after the programming. The data that is read out from the CAM cells after the programming is compared with the I/O-input data as expected values (see FIG. 1D). At this point, if an I/O-input expected value indicates "non-programming" for an already programmed CAM cell, the comparison result is "fail", and the verifying operation ends in failure.

In the case where the above described designation method involving interface 2 is employed, only the CAM cells to be programmed are designated by a command input. Therefore, the expected values corresponding to the CAM cells not programmed on the same word line cannot be produced, and a verifying operation cannot be done.

SUMMARY OF THE INVENTION

It is therefore an object of the present invention to provide a semiconductor device and an address allocation method and a verification method therefore in which the above disadvantages are eliminated.

A more specific object of the present invention is to provide a semiconductor device having CAM cells on which data rewrite and verification can be properly performed, and an address allocation method and a verification method therefor.

To achieve the above object of the present invention, a semiconductor device of the present invention includes a cell array that stores operation setting information for the semiconductor device and a control unit that controls read and write operations to be performed on the cell array. The control unit allocates different row addresses for respective functions of the operation setting information. As the different row addresses are allocated to the respective functions of the operation setting information, stress (gate disturb) is not caused in the cell array of unselected functions at the time of programming.

In the above semiconductor device, the control unit may also allocate different column addresses for the respective functions of the operation setting information. As the different column addresses are allocated to the respective functions of the operation setting information, stress (drain disturb) is not caused in the cell array of unselected functions at the time of programming.

In the above semiconductor device, the control unit may allocate continuous column addresses for the respective functions of the operation setting information. As the continuous column addresses are allocated for the respective functions, the data can be read out successively, and reading time can thus be shortened.

In the above semiconductor device, the control unit may further allocate the operation setting information to column addresses selected by one of the row addresses. Alternatively, the control unit allocates the operation setting information to all I/Os of an arbitrary column selected by the row address. In this manner, the number of reading cycles can be minimized, thereby reducing reading time.

In the above semiconductor device, memory cells accessed by different row addresses are isolated from each other. Since the line pattern of local bit lines is cut off between the memory cells of different row addresses, the data can be read out simply by switching column addresses, with a word line being selected between memory cells of respective functions.

In the above semiconductor device, memory cells may be connected to switches for selectively connecting the memory cells to bit lines arranged on a corresponding column. With this structure, the data can be read out simply by switching column addresses, with a word line being selected between memory cells of respective functions.

In the above semiconductor device, the cell array further includes cells for each column, and memory cells not storing the operation setting information are isolated from bit lines arranged on a corresponding column. Accordingly, stress is not caused in the cell array of unselected functions at the time of programming.

In the above semiconductor device, the control unit may also select all word lines on the cell array, and read the operation setting information from the cell array while successively changing the column addresses. With this structure, the data can be read out simply by switching column addresses without switching word lines and the reading time can therefore be shortened.

In the above semiconductor device, the control unit may include a table that converts the number of a designated memory cell into an address of a corresponding memory cell. Since a designated memory cell number can be converted into the address of the designated cell, programming can then be performed on the desired cell.

The present invention also provides a method of allocating addresses to a cell array that stores operation setting information as to a semiconductor device. This method includes the step of allocating different row addresses to respective functions of the operation setting information. Since different row addresses are allocated to the respective functions of the operation setting information, stress is not caused in the cell array of unselected functions at the time of programming. Also, erasing can be performed for each function.

This method further includes the step of allocating different column addresses for the respective functions of the operation setting information. By this method, the data can be read out with different column addresses for the respective functions of the operation setting information.

This method further includes the step of allocating continuous column addresses for the respective functions of the operation setting information. By this method, the operation setting information of respective functions can be readily read out.

This method further includes the step of selecting all word lines on the cell array and successively changing the column addresses to read data from the cell array. Accordingly, the operation setting information can be read out simply by switching the column addresses, without switching word lines.

The present invention also provides a semiconductor device that includes a cell array that stores the operation setting information as to the semiconductor device, a write circuit that simultaneously programs memory cells in the cell array, and a verification circuit that verifies a programming result of only a memory cell that is actually programmed. In this manner, only the programming results of the actually programmed cell need be verified.

In the above semiconductor device, the verification circuit includes comparator circuits that compare expected value data obtained by normal programming with data that is read from the memory cells after programming and a control unit that makes a pseudo-pass for comparator outputs related to programming results of memory cells that are not programmed. In this manner, a control operation is performed to make a pseudo-pass for the programming results from the comparator circuits allocated to unprogrammed cells. Accordingly, the programming result of the programmed cell can be reflected in the verification.

In the above semiconductor device, the control unit identifies a memory cell in an erased state prior to the programming, the memory cell being designated as to be programmed by an external input, and the semiconductor device further includes a circuit that generates expected value data obtained by normal programming in response to an instruction from the control unit, outputting the expected value data to one of the comparator circuits related to the designated memory cell. In this manner, the actual programmed cell is detected and the expected value data is output to the comparator circuit allocated to the cell. Thus, the programming result of the programmed cell can be accurately determined.

The present invention also provides a semiconductor device that includes a cell array that stores operation setting information as to the semiconductor device, a write circuit that simultaneously programs memory cells in the cell array, a volatile memory circuit that stores data stored in the memory cells prior to programming, and a verification circuit that verifies, with the data stored in the volatile memory circuit, a memory cell that is not programmed, and verifies another memory cell that is actually programmed with expected value data obtained by normal programming. In this manner, verification is performed on unprogrammed cells using the stored data. For an actually programmed cell, the programming result is verified using the expected value data obtained when programming is properly performed. Thus, the programming result of the programmed cell can be accurately verified.

In the above semiconductor device, the verification circuit may also include comparator circuits that compare expected value data obtained by normal programming with data that is read from the memory cells or a sense amplifier after programming and a control unit that identifies the memory cell that is actually programmed and causes one of the comparator circuits related to the memory cell actually programmed to verify a programming result thereof with the expected value data obtained by normal programming. With this structure, the actually programmed cell is identified and the programming result of the programmed cell can be accurately verified.

In the above semiconductor device, the control unit identifies a memory cell in an erased state prior to programming, the memory cell being designated as to be programmed by an external input, and the semiconductor device further includes a circuit that changes the expected value data stored in the volatile memory circuit and related to a memory cell in an erased state prior to programming to the expected value data obtained by normal programming, outputting the expected data value thus changed to one of the comparator circuits. With this structure, the actually programmed cell is identified, and the programming result of the programmed cell can be accurately verified.

In the above semiconductor device, the control unit externally receives an instruction signal indicating whether each memory cell should be programmed and identifies a memory cell to be actually programmed by determining whether the memory cell to be programmed is in an erased state. With this structure, a cell to be programmed is identified by an external instruction signal, and programming is performed on the identified cell.

In the above semiconductor device, the control unit decodes address information externally supplied to identify a memory cell to be programmed, the control unit identifying a memory cell to be actually programmed by determining whether the memory cell to be programmed is in an erased state. With this structure, a cell to be programmed is identified with externally input address information and programming is performed on the identified cell.

In the above semiconductor device, the control unit changes an interface that designates a memory cell to be programmed in response to a mode switching signal that is externally supplied. With this structure, a cell to be programmed can be designated in accordance with interfaces.

In the above semiconductor device, the verification circuit is shared between verification after programming of the cell array storing the operation setting information and verification after programming of a regular cell array storing regular data. With this structure, the verification functions can be shared, being performed by one verification circuit. Accordingly, the circuit size of the semiconductor device can be reduced.

In the above semiconductor device, the comparator circuits compare the expected value data obtained by normal programming with data read from the memory cells after programming in response to a mode signal for switching an operation mode to programming of the cell array storing the operation setting information. With this structure, the comparator circuits operate only at the time of verification.

In the above semiconductor device, the comparator circuits use outputs of the volatile memory circuit at the time of programming of the cell array storing the operation setting information and the comparator circuits use outputs of a circuit holding the expected value data obtained by normal programming of the memory cell at the time of programming a regular cell. With this structure, different control operations can be performed for verification between the programming of the cell array that stores the operation setting information and the programming of the regular cell array.

The present invention also provides a method of verifying a cell array that stores the operation setting information as to a semiconductor device. This method includes the step of verifying a programming result of only a memory cell that is actually programmed among memory cells in the cell array. By this method, only the programming result of the actually programmed cell need be verified.

The present invention also provides a method of verifying a cell array that stores the operation setting information as to a semiconductor device. This method includes the steps of verifying a memory cell that is not programmed with data stored in the memory cell prior to programming and verifying another memory cell that is actually programmed with expected value data obtained by normal programming. By this method, verification is performed on unprogrammed cells, using the stored data. Thus for an actually programmed cell, the programming result is verified using the expected value data that is obtained when programming is properly performed. Therefore, the programming result of the programmed cell can be accurately verified.

With any of the above semiconductor devices each having a cell array that stores the operation setting information, data rewrite and verification can properly be performed.

BRIEF DESCRIPTION OF THE DRAWINGS

Other objects, features and advantages of the present invention will become more apparent from the following detailed description when read in conjunction with the accompanying drawings, in which:

FIG. 3 illustrates an example bitmap of a CAM cell array in accordance with the first embodiment of the present invention;

FIG. 4 illustrates an example bitmap of a CAM cell array in accordance with the first embodiment of the present invention;

FIG. 5 shows the correspondence between the WP bit numbers and the addresses in accordance with the first embodiment of the present invention;

FIG. 6 shows the conversion of the WP addresses into the addresses of the CAM cell array in accordance with the first embodiment of the present invention;

FIGS. 7A and 7B illustrate the memory cell structures of a CAM cell array and a regular cell array in accordance with the first embodiment of the present invention;

FIGS. 14A through 14D illustrate the procedures to be carried out by the verification circuit in the I/O mode in accordance with the second embodiment of the present invention;

DESCRIPTION OF THE PREFERRED EMBODIMENTS

The following is a description of preferred embodiments of the present invention, with reference to the accompanying drawings.

First Embodiment

Figure 1:
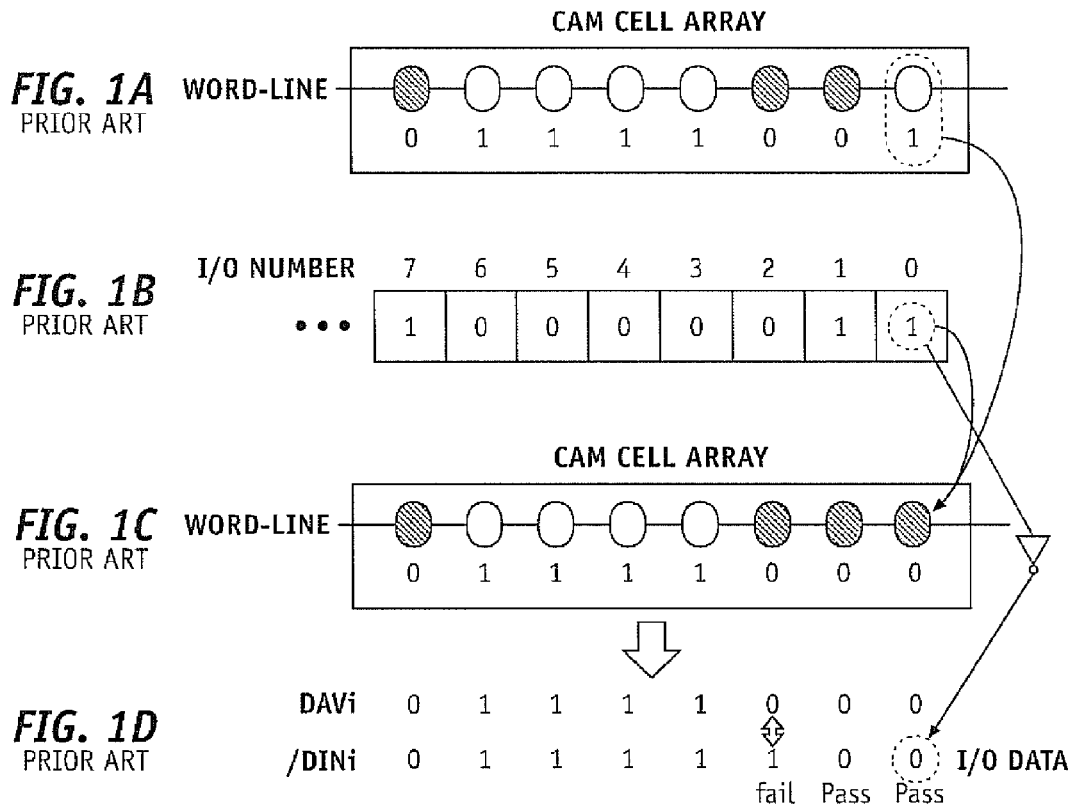
FIGS. 1A through 1D illustrate problems with the prior art.
Figure 2:
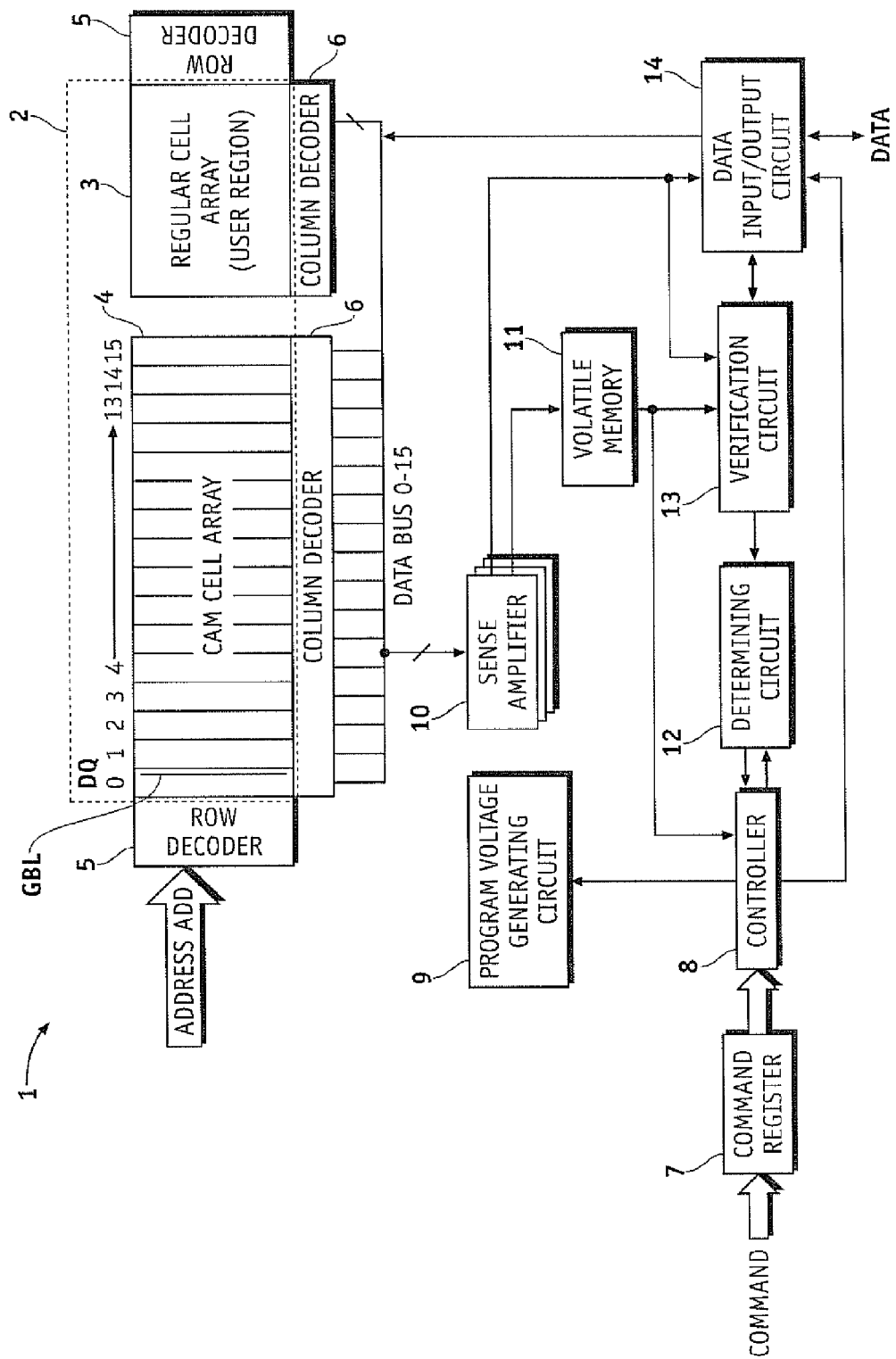
FIG. 2 illustrates the structure of a semiconductor device in accordance with a first embodiment of the present invention.
Figure 8A:
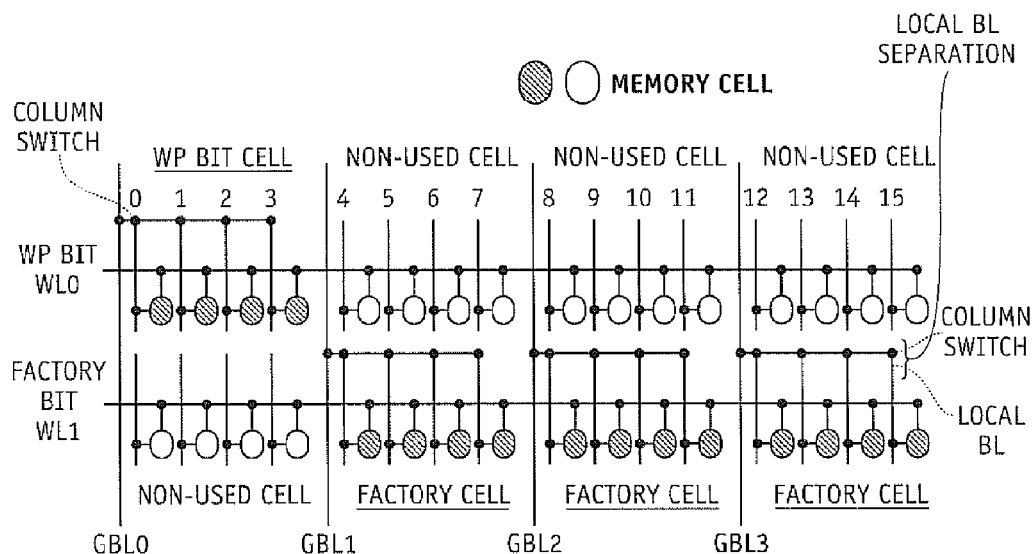
FIGS. 8A and 8B illustrate the memory cell structures of a CAM cell array and a regular cell array in accordance with the first embodiment of the present invention.
Figure 8B:
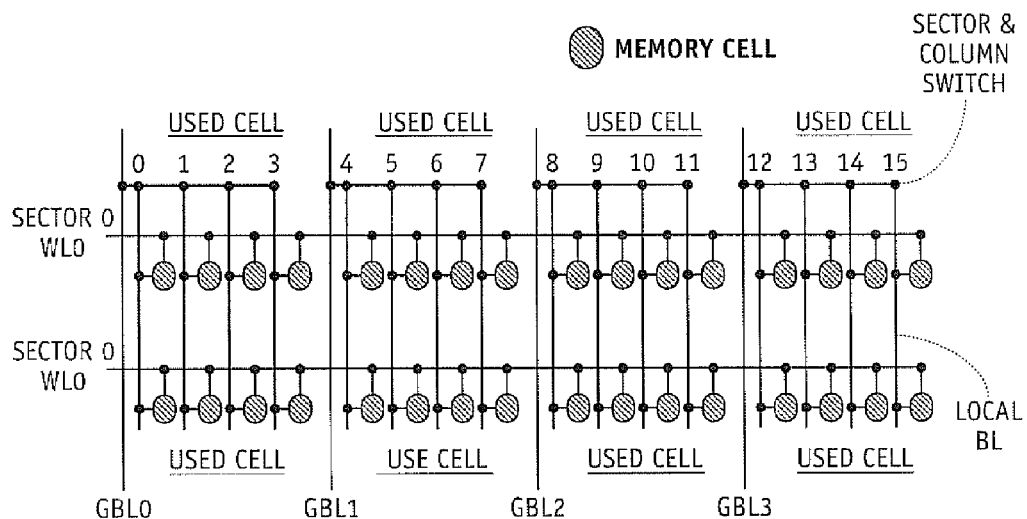

Referring first to FIG. 2, the structure of this embodiment is described. A semiconductor device 1 in accordance with this embodiment includes a regular cell array 3 that stores regular data and a CAM cell array 4 that stores CAM data. The regular cell array 3 and the CAM cell array 4 constitute a cell array unit 2. The CAM cell array 4 is formed with memory cells disposed on multiple rows and columns like the regular cell array 3. The CAM cell array 4 stores the operation setting information (so-called CAM data) for the semiconductor device 1. For example, the write protect information for the regular cell array 3, the internal voltage control information for the semiconductor device 1, the internal timing control information, the operation mode switch information, and the memory cell redundant bit information are stored in the CAM cell array 4. The semiconductor device 1 also includes a peripheral circuit that performs data write, read, and erase on the cell arrays. As shown in FIG. 1, the peripheral circuit includes a row decoder 5, a column decoder 6, a command register 7, a controller 8, a program voltage generating circuit 9, a sense amplifier 10, a volatile memory unit 11, a determining unit 12, a verification circuit 13, and a data input/output circuit 14.

The row decoder 5 selectively drives word lines WL, based on the respective addresses, at the time of writing, erasing, or reading data. A predetermined voltage is applied to the word line driver (not shown) from the program voltage generating circuit 9. The column decoder 6 selects a column from the cell array, i.e., a global bit line or a local bit line, based on an externally input address.

The command register 7 decodes an external command to generate an internal control signal. The controller 8 controls the internal operation, in response to the internal control signal decoded by the command register 7. The controller 8 is formed with a microprocessor, for example, and controls the program voltage generating circuit 9, the determining circuit 12, and the verification circuit 13.

The CAM data stored in the CAM cell array 4 is transferred to and stored in the volatile memory unit 11 at the time of switching on the semiconductor device 1 or resetting the hardware. With the CAM data being read into the volatile memory unit 11, a delay during a reading operation can be prevented when the CAM data is read out of the volatile memory 11 at the time of read-accessing the regular cell array 3. The reading operation period should preferably be short, because the activating period becomes longer unless the CAM data is transferred in a short time.

The data input/output circuit 14 includes an I/O terminal that inputs a program instruction from the outside and outputs readout data. The data input/output circuit 14 performs data write (programming) and read on the CAM cell array 4.

Next, the structure of the CAM cell array 4 is described. FIG. 3 shows a bitmap illustrating the allocation of the CAM data to the CAM cell array 4. The CAM cell array 4 is divided into function blocks including a user block and a factory block. Data erase may be performed in each function block.

A "user block" is a write region in which a user writes a write-protect bit (hereinafter also referred to as "WP bit") or the like. A "write-protect" bit is a bit for controlling the programming or erasing of memory cells, and a unit write-protect bit is formed with an arbitrary number of sectors (hereinafter, the unit will be referred to as the "sector group"). In the example illustrated in FIG. 3, WP bits are preferably allocated to all the I/Os DQ0 through DQ15. A word line (a row address) and four local bit lines (LBL), i.e., four column addresses (LBL0 through LBL3), are allocated to each one I/O, and a global bit line (GBL), GBL0, is allocated to one I/O. Here, the allocation of the WP bits to all the I/Os DQ0 through DQ15 is to allocate data to all the memory cell of a column selected by a row address. If the number of WP bits is not an integer divisible by the number of I/Os, emphasis may be put on I/O allocation in column allocation, or emphasis may be put on column allocation in I/O allocation. For example, if the number of WP bits is 60 and the number of I/Os is 16, I/Os (DQ) corresponding to the WP bits 60, 61, 62, and 63 of the last column address (000011) are not allocated, or the I/Os (DQ) corresponding to the WP bits 1, 2, 3, and 4 of the top column address (000000) are shifted and allocated, by a column allocation method, with emphasis being put on I/O allocation. By the I/O allocation method, with emphasis being put on column allocation, the I/Os (DQ) corresponding to the WP bits 15, 31, 47, and 63 are skipped.

The user block is formed with 64 WP bits 0 through 63, and are bit-allocated in accordance with the correspondence relation (a conversion table) shown in FIG. 5 and the conversion table shown in FIG. 6. As shown in FIGS. 5 and 6, the WP bits 0 through 63 correspond to the addresses A17 through A20 of the DQ terminals as I/Os, and the addresses A21 and A22 as column addresses.

The factory block is a function block in which the vender maker performs rewrite, but users cannot perform rewrite. In this function block, redundant data, internal voltage trimming data, and internal timing trimming data are written.

The factory block shown in FIG. 3 is formed with the 16 bits TR0 through TR15 for trimming, the 32 bits of RED-SECA through REDSECD for sector redundancy, and the 128 bits of REDCOL (0-0) through REDCOL(7-1) for column redundancy. Each 8 sector redundancy bits of REDSECA through REDSECD store one defect relief address. Each 8 column redundancy bits of REDCOL (0-0) through RED-COL (7-1) store one defect relief address.

The factory block is also allocated to DQ0 through DQ15, as shown in FIG. 3. One word line and 11 local bit lines (LBL), i.e., eleven column addresses (LBL4 through LBL14), arc allocated to each I/O, and three global bit lines (GBL) (GBL1 through GBL3) are allocated to each I/O. As shown in FIG. 4, the factory block is also formed with 64 bits, like the user block, and the 64 bits are allocated to DQ0 through DQ15.

FIG. 7A illustrates the structure of the CAM cell array 4 in detail, and FIG. 7B illustrates the structure of the regular cell array 3 in detail. In the CAM cell array 4 shown in FIG. 7A, the factory block and the user block have word lines that are independent of each other, so that the factory block is not adversely affected by the gate disturb in memory information due to rewrite in the user block. In other words, different row addresses are allocated to the factory block and the user block. The row decoder 5 shown in FIG. 2 allocates the CAM data of the respective function blocks to the different row addresses based on externally input addresses. In FIG. 7A, the word line WL0 allocated to the WP bits contained in the user block and the word lines WL1 allocated to the factory bits contained in the factory block are shown. Further, in one block (the user block or the factory block), the number of word lines to be allocated is restricted to the smallest possible number. This is because the structure is designed to be capable of collectively erasing the data in one unit function block. Here, the "gate disturb" is a phenomenon in which the bit lines are connected to the same word line to which the memory cells to be programmed are connected, and charge gain is caused due to a high voltage applied to the gates of unselected memory cells at the time of programming. Because of this phenomenon, the data of the unselected memory cells change from "1 (the threshold value being low)" to "0 (the threshold value being high)" due to charge gain.

Likewise, the column decoder 6 (FIG. 2) allocates the CAM data of the respective function blocks to different column addresses based on externally input addresses. Also, address allocation is performed in such a manner that the allocated column addresses are continuous between the factory block and the user block.

So as to protect the factory block from drain disturb of the memory information due to rewrite or the like performed in the user block, the bit lines of the factory block and the user block are separated from each other, as shown in FIG. 7A. In other words, the column decoder 6 allocates column addresses that are independent of each other to the user block and the factory block. Further, the column decoder 6 allocates addresses in such a manner that the column addresses are continuous between the different function blocks. Here, the "bit line separation" indicates both the physical separation and the electric separation of the local bit lines and the global bit lines. "Drain disturb" is a phenomenon in which the word line is connected to the same bit lines to which the memory cells to be programmed are connected, and charge loss is caused due to a high voltage applied to the drains of unselected memory cells at the time of programming. Because of this phenomenon, the data of the unselected memory cells change from "0 (the threshold value being high)" to "1 (the threshold value being low)" due to charge loss.

Also, with all the word lines (the word lines WL1 and WL2, for example) being selected, the same column addresses are not shared between the function blocks, and the column addresses are made continuous between the function blocks, so that all the CAM data can be read out simply by switching the column addresses. In this manner, the time for switching the word lines can be saved, and CAM data can be transferred from the CAM cell array 4 to the volatile memory unit 11 (FIG. 2) in a short time. In such a case, when more than one word line is selected at the same time, the bit lines to which unnecessary cell data is connected arc severed, so that the necessary cell data and the unnecessary cell data cannot be selected through the same bit line.

Taking advantage of the fact that the user block and the factory block do not share the same column addresses, the line pattern of the local bit lines (LBL) between the user block and the factory block is physically cut off, and the cut-off local bit lines (LBL) are not connected to the global bit lines (a contact via is not used, for example). Alternatively, the user block and the factory block may be separated from each other as sectors, and column switches for connecting with the global bit lines are provided for the user block and the factory block, thereby electrically severing the user block and the factory block from each other.

With this structure, when the data is to be read from the CAM cell array 4 into the volatile memory unit 11 at the time of power supply or the like, the CAM data can be read out simply by switching the column addresses, with the word line of the user block and the word line of the factory block being simultaneously selected. Since there is no need to switch the word lines, the total time required for reading all the bits of the CAM data can be shortened.

Figure 9:
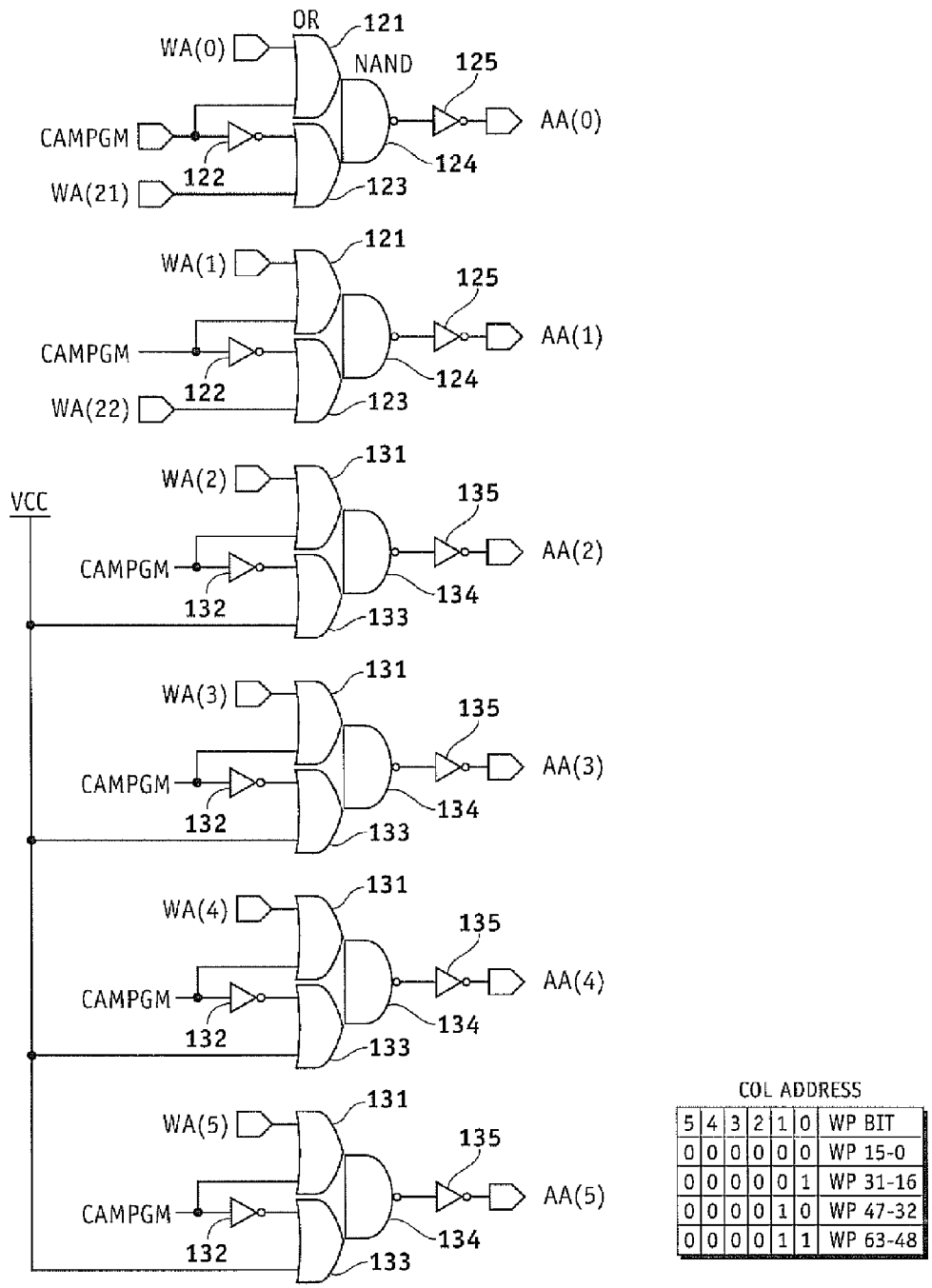
FIG. 9 illustrates the structures of logic circuits that convert WP addresses into CAM column addresses in accordance with the first embodiment of the present invention.

FIG. 9 illustrates the structures of conversion circuits that convert the address signals for programming/erasing operations into the column address signals for the respective banks. The conversion circuits are provided in the column decoder 6 (FIG. 2). CAM program mode signals (CAMPGM) are switched between an activated state and an inactivated state, so that switching can be performed between a column address of the regular cell array 3 and a column address of the CAM cell array 4.

The conversion circuits include OR gates 121 to which address signals WA(0) or WA(1) for a programming/erasing operation and a CAMPGM signal are input, OR gates 123 to which the inverted output of the CAMPGM signal and address signals WA(21) or WA(22) are input, NAND gates 124 to which the outputs of the OR gates 121 and 123 are input, and inverters 125 that invert the outputs of the NAND gates 124. The outputs of the inverters 125 are column addresses AA(0) and AA(1). If the CAMPGM signal is in the inactivated state, the address signals WA(1) and WA(0) serve as the column addresses AA(1) and AA(0).

The conversion circuits also include OR gates 131 to which address signals WA(2), WA(3), WA(4), and WA(5) are input; OR gates 133 to which a power supply voltage VCC and the inverted outputs of CAMPGM signals are input; NAND gates 134 to which the outputs of the OR gates 131 and 133 are input; and inverters 135 that invert the outputs of the NAND gates 134. The outputs of the inverters 135 serve as column addresses AA(2), AA(3), AA(4), and AA(5).

Figure 10:
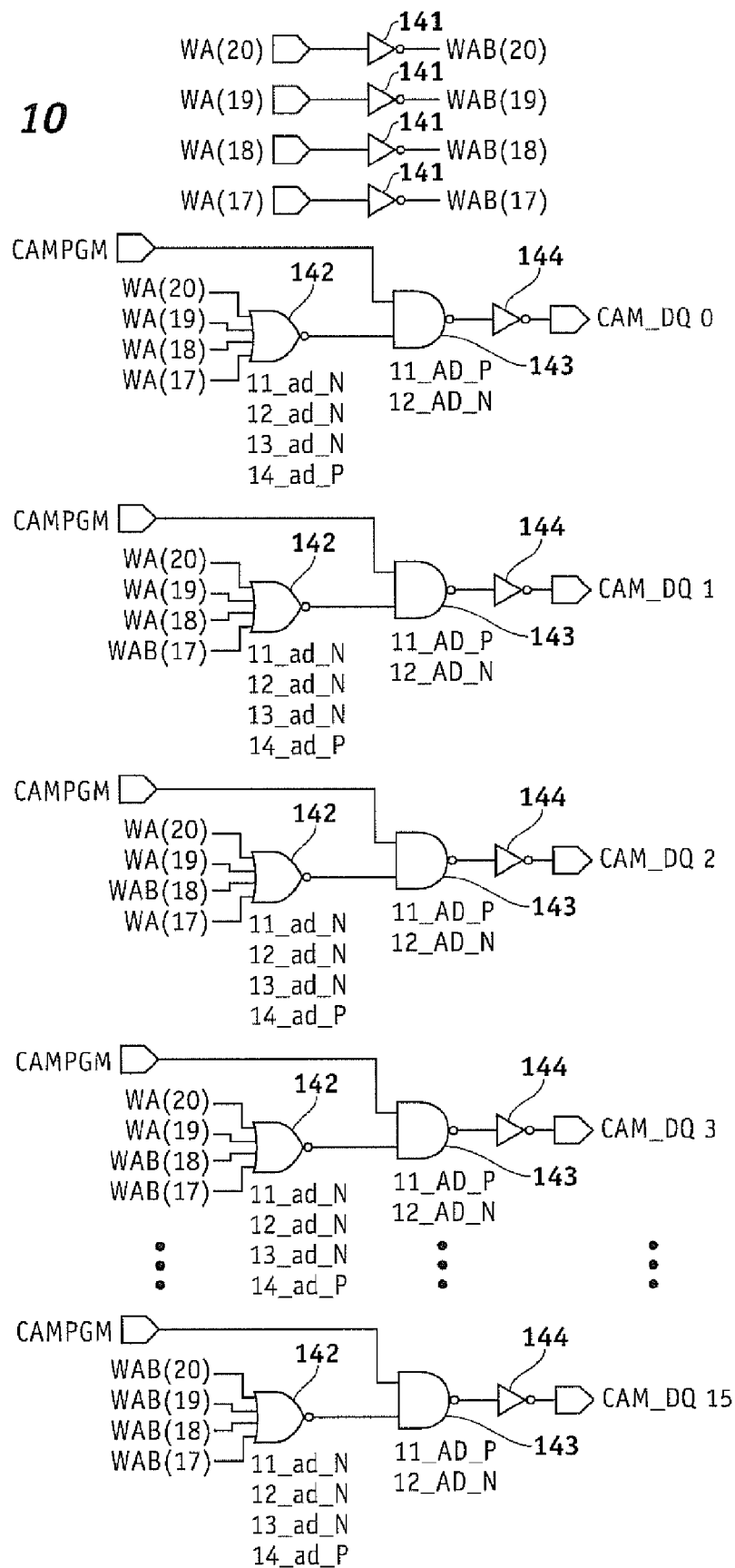
FIG. 10 illustrates the structures of logic circuits that convert WP addresses into DQs in accordance with the first embodiment of the present invention.

FIG. 10 illustrates conversion circuits that convert the address signals for programming/erasing operations into DQs. These conversion circuits are provided as switches in the data input/output circuit 14. The conversion circuit that generates DQ0 includes a NOR gate 142 to which address signals WA(20), WA(19), WA(18), and WA(17) are input; a NAND gate 143 to which a CAMPGM signal and the output of the NOR gate 142 are input; and an inverter 144 that inverts the output of the NAND gate 143. The conversion circuits that generate DQ1 through DQ15 also have the same circuit structure as above.

If the CAMPGM signal is in the activated state, the address signals WA(0) through WA(17) are allocated to CAM_DQ15 through CAM_DQ0. If the regular cell array 3 is in a selected state (i.e., the CAMPGM signal is in the inactivated state), CAM_DQ15 through CAM_DQ0 are placed in an inactivated state.

At the time of programming a write-protect bit, only the DQ to be programmed is activated, and applied stress, expected values, and identification signals are controlled through the conversion circuits shown in FIG. 10, so that the DQs not to be programmed are ignored.

Although the above described embodiment is a preferred embodiment, the present invention is not limited to this embodiment. For example, the factory block may include a one-time programmable ROM (OTP ROM). An OTP ROM is a functional memory a user can program only once. The OTP ROM differs from the factory block in terms of the function allowed to users, but is separated from the user block in which users can perform programming and erasing repeatedly, in view of the OTP function that does not allow reprogramming. In short, it is necessary in this structure to also avoid gate disturb and drain disturb.

It is also possible to form the user block with a read bit block, instead of a write bit block. In such a case, read control is performed for each desired sector.

In the above described embodiment, there is physical separation among the local bit lines and electrical separation from the global bit lines between the factory block and the user block. However, the present invention is not limited to this structure, and it is also possible to physically or electrically separate the global bit lines between the factory block and the user block.

The regular cell array and the CAM cell array may be connected so as to share a data bus or may be connected so as to share the global bit lines of the user block and the factory block.

Also, wells may be separated or shared between the user block and the factory block. If shared, the die size can be reduced. In such a case, floating control is performed on the word line of the factory block at the time of performing an erasing operation in the user block.

Second Embodiment

Figure 11:
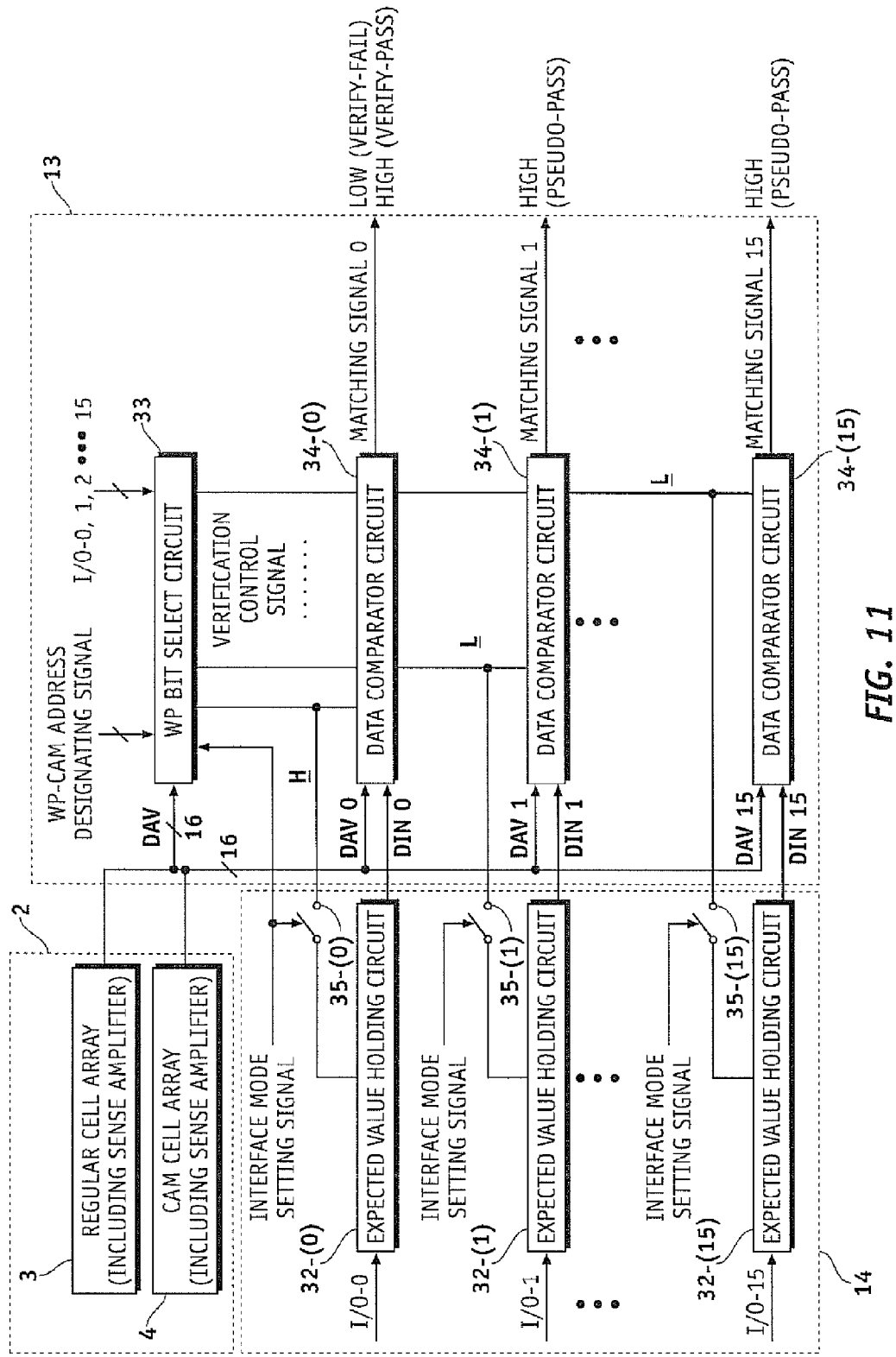
FIG. 11 illustrates the structures of a cell array and a verification circuit in accordance with a second embodiment of the present invention.

Referring now to FIG. 11, the structure in accordance with a second embodiment of the present invention is described. FIG. 11 illustrates a cell array unit 2 (a regular cell array 3 and a CAM cell array 4) that store the data for a semiconductor device, a verification circuit 13 that confirms a data written state or a data erased state of the cell array 2, and expected value holding circuits 32 disposed in a data input/output circuit 14. In this embodiment, a sixteen-bit simultaneous write mode is also employed so that programming can be performed through simultaneous access to the sixteen memory cells of the regular cell array 3 or the CAM cell array 4.

A verification circuit 13 includes a WP bit select circuit 33 and data comparator circuits 34. The number of expected value holding circuits 32 and the number of data comparator circuits 34 disposed in the data input/output circuit 14 are sixteen, which is the same as the number of I/Os.

An interface mode setting signal, a signal input from each corresponding I/O, and an address signal (WP-CAM address designating signal) that designates a write-protect CAM (WP-CAM) are input to the WP bit select circuit 33.

There are two methods of designating a CAM cell to be programmed. In accordance with one of the methods, the information "1" is input to the I/O corresponding to the CAM cell to be programmed while the information "0" is input to the I/Os not to be programmed ("I/O mode"). In accordance with the other method, the corresponding address is input to the CAM cell to be programmed ("address mode"). The interface mode setting signal is a signal for switching the method of designating a CAM cell to be programmed between the above two methods.

Figure 12:
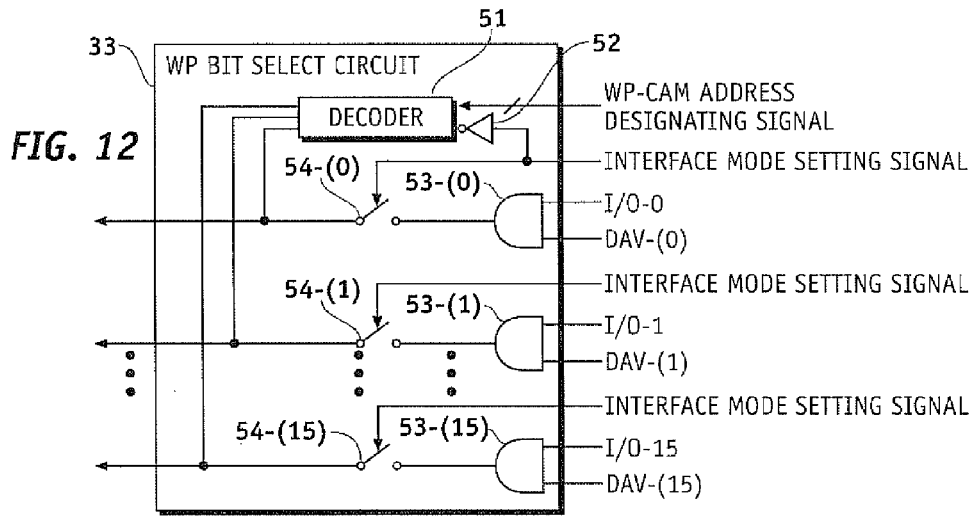
FIG. 12 illustrates the structure of a WP bit select circuit in accordance with the second embodiment of the present invention.

FIG. 12 illustrates the structure of the WP bit select circuit 33 in detail. As shown in FIG. 12, the WP bit select circuit 33 includes a decoder 51, AND gates 53, and switches 54. The number of AND gates 53 and the number of switches 54 are both sixteen, which is the same as the number of I/Os. With this structure, the data comparator circuit 34 through which a pass is performed on pseudo verification is selected.

When the address mode is set by the interface mode setting signal, the switches 54-(0) through 54-(15) are turned OFF and the WP-CAM address designating signal is decoded by the decoder 51 to generate a verification control signal. When the I/O mode is set by the interface mode setting signal, the decoder 51 is turned OFF by the interface mode setting signal input to the decoder 51 via the inverter 52, and the switches 54-(0) through 54-(15) are turned ON.

The signals I/O-(0) through I/O(15) from the respective I/Os and pre-read data (DAV) read out from the CAM cells in advance are input to the AND gates 53-(0) through 53-(15), which obtains the logic products of those signals. More specifically, if the data prior to the programming of the CAM cell and the data input from the I/O are both "1", a high-level signal is output as a verification control signal. In other cases, a low-level signal is output as a verification control signal.

The expected value holding circuits 32-(0) through 32-(15) are provided for the respective I/Os, as shown in FIG. 11, and holds I/O input information. The held information is output as expected value data to the data comparator circuits 34 after programming of the regular cell array 3. The expected value holding circuits 32-(0) through 32-(15) also holds information that is I/O-input at the time of programming of the CAM cell array 4 in the I/O mode. The held information is output as expected value data to the data comparator circuits 34 after the programming of the CAM cell array 4. Further, the expected value holding circuits 32 generate expected values, with the verification control signal output from the WP bit select circuit 33, when the switches 35 are turned ON by the interface mode setting signal at the time of programming of the CAM cell array 4 in the address mode. The data is then output as expected value data to the data comparator circuits 34 after the programming of the CAM cell array 4.

The data comparator circuits 34-(0) through 34-(15) are also provided for the respective I/Os, and compare the data read out from the regular cell array 3 or the CAM cell array 4 with the data (the expected values) stored in the expected value holding circuits 32-(0) through 32-(15). At the time of programming of the CAM cell array 4, the data comparator circuits 34 perform a pseudo-verification pass on the cells not to be programmed using the verification control signal from the WP bit select circuit 33.

Figure 13:
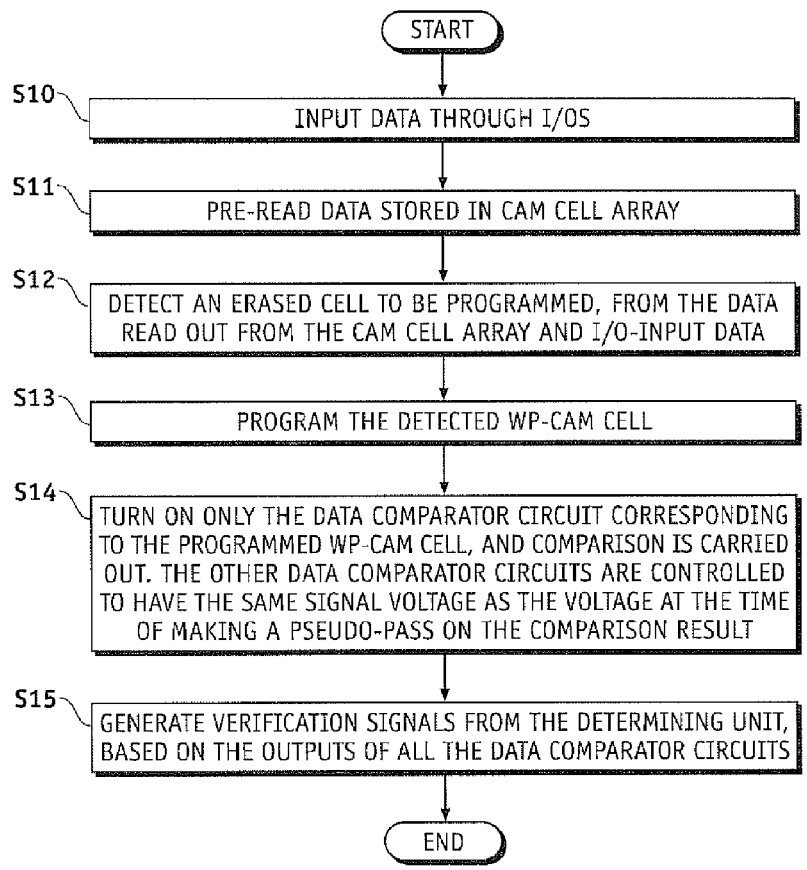
FIG. 13 is a flowchart of the operation of the verification circuit in the I/O mode in accordance with the second embodiment of the present invention.

Referring now to the flowchart of FIG. 13 and the diagrams of FIGS. 14A to 14D, the operation of programming the CAM cell array 4 set in the I/O mode in accordance with this second embodiment is described. In this embodiment, the setting of "write protect" can be performed on each sector group consisting of sectors, where I/Os are allocated to each sector. When a sector group in which the "write protect" is to be set is selected, protection data is programmed in the WP-CAM cell in the selected sector group.

First, CAM program setting signals (I/O-0, 1, ..., 15) for designating a WP-CAM cell to be programmed are input from the respective I/Os (step S10). The information "1" for commanding programming is input to the I/O corresponding to the WP-CAM cell to be programmed, and the information "0" for prohibiting programming is input to the other I/Os (see FIG. 14B).

The data that is already stored in the WP-CAM cells is read out in advance (pre-read) (step S11). Judging from the pre-read data, it is determined whether each WP-CAM cell is in a data written state. If data has already been written and programming has already been performed, the information "0" is held. If a WP-CAM cell is in an erased state without written data, the information "1" is held in the I/O (see FIG. 14A).

Next, a WP-CAM cell that is currently in an erased state and in which write is allowed by the I/O input signal is detected (step S12). More specifically, a WP-CAM cell having pre-read data of "1", which indicates an erased state, and also having the I/O input of "1" is detected. In this detection, the expected value holding circuits 32 and the data comparator circuits 34 shown in FIG. 11 may be used.

Programming is then performed on the detected WP-CAM cell (step S13) (see FIG. 14C, for example). As the programming is performed, the verification circuit 13 determines whether the data has definitely been written in the WP-CAM cell. At this point, the switches 35-(0) through 35-(15) provided for the respective I/Os are turned OFF by the interface mode setting signals for setting the I/O mode. The interface mode setting signal is also input to the WP bit select circuit 33, so as to turn the switches 54-(0) through 54-(15) ON.

The WP bit select circuit 33 obtains the logic products of the pre-read data read from the WP-CAM cells and the I/O-input signals (I/O-0, 1, ..., 15) through the AND gates 53-(0) through 53-(15) to generate verification control signals. If the I/O input is "1" commanding programming, and the pre-read data is "1" indicating an erased cell, a high-level verification control signal is output to the corresponding data comparator circuit 34. In other cases, a low-level verification control signal is output to the corresponding data comparator circuit 34.

The expected value holding circuits 32-(0) through 32-(15) latch the input signals I/O-(0), (1), ..., (15) as they are, and output the latched data as DIN0 through DIN15 to the data comparator circuits 34-(0) through 34-(15) in accordance with predetermined timing. The data is referred to as the expected value data. The verification control signal is input from the WP bit select circuit 33 to each of the data comparator circuits 34-(0) through 34-(15).

The data comparator circuits 34-(0) through 34-(15) compare the data read out from the WP-CAM cells, i.e., the data read out after programming, with the expected values read out from the expected value holding circuits 32-(0) through 32-(15). At this point, in each data comparator circuit 34 to which a low-level verification control signal is input from the WP bit select circuit 33, comparison is not performed (step S14); instead a high-level matching signal is output so as to make a pseudo-pass for the verification (see FIG. 14D). In each data comparator circuit 34 to which a high-level verification control signal is input from the WP bit select circuit 33, the expected value data that is input from the corresponding expected value holding circuit 32 is compared with the data after programming the WP-CAM cell (step S14). If the I/O input is "1" commanding programming and the data read from the WP-CAM cell after programming is "1" indicating an erased state, a low-level signal indicating "Fail" is output to the determining circuit 12. As shown in FIG. 14D, if the I/O input is "1" and the data read from the WP-CAM cell after programming is "0" indicating a programmed state, a high-level signal indicating verification pass is output to the determining circuit 12.

When all the matching signals that are output from the data comparator circuits 34-(0) through 34-(15) are at the "H" level, the determining circuit 12 outputs a verification signal indicating data write success to the controller (step S15).

As described above, a pseudo-pass is performed on the comparison results of the data comparator circuits allocated to unprogrammed CAM cells in this embodiment. Accordingly, the programming results of the programmed CAM cell can be reflected in the verification.

Figure 15:
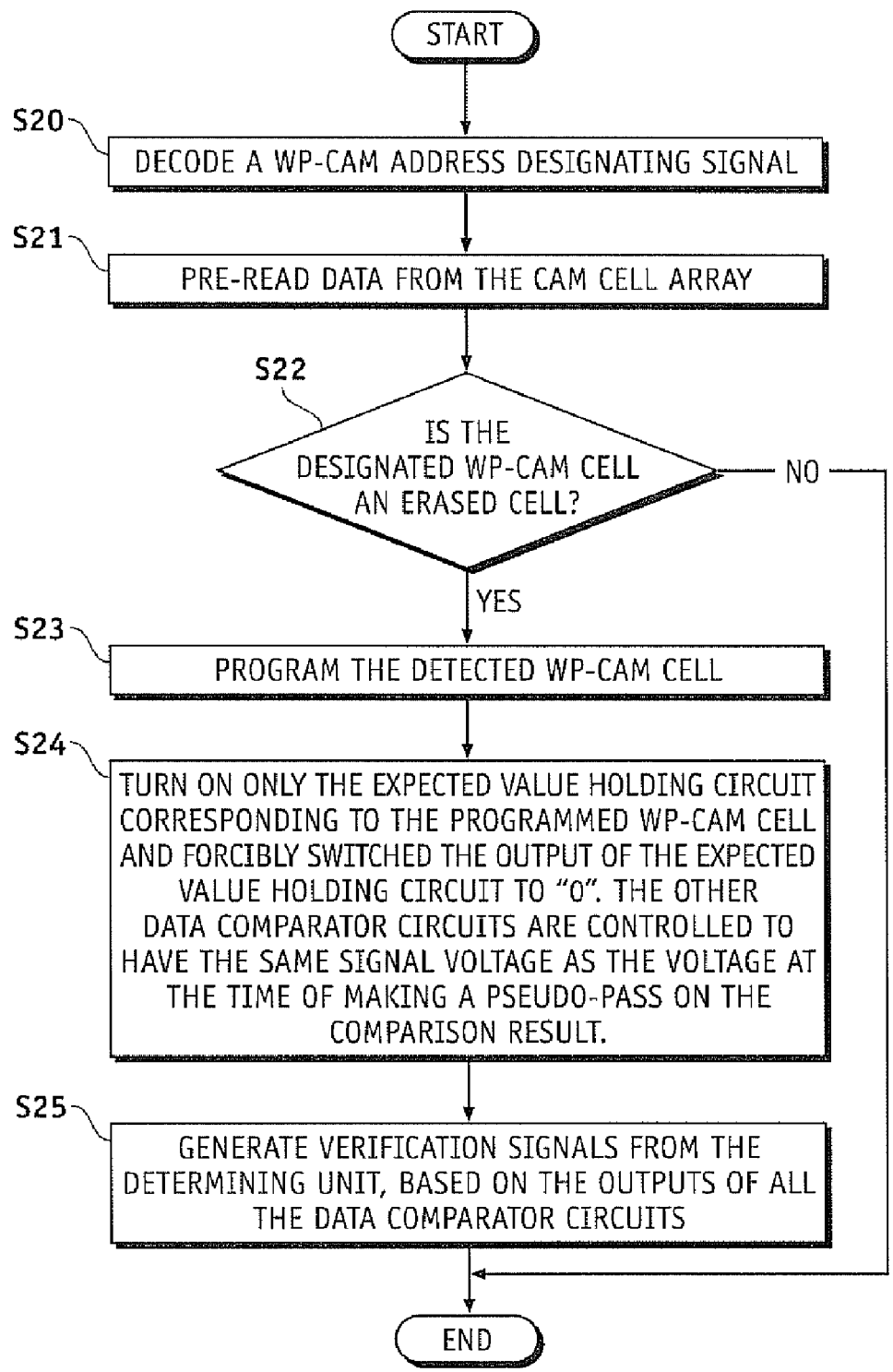
FIG. 15 is a flowchart of the operation of the verification circuit in the address mode in accordance with the second embodiment of the present invention.
Figure 16:
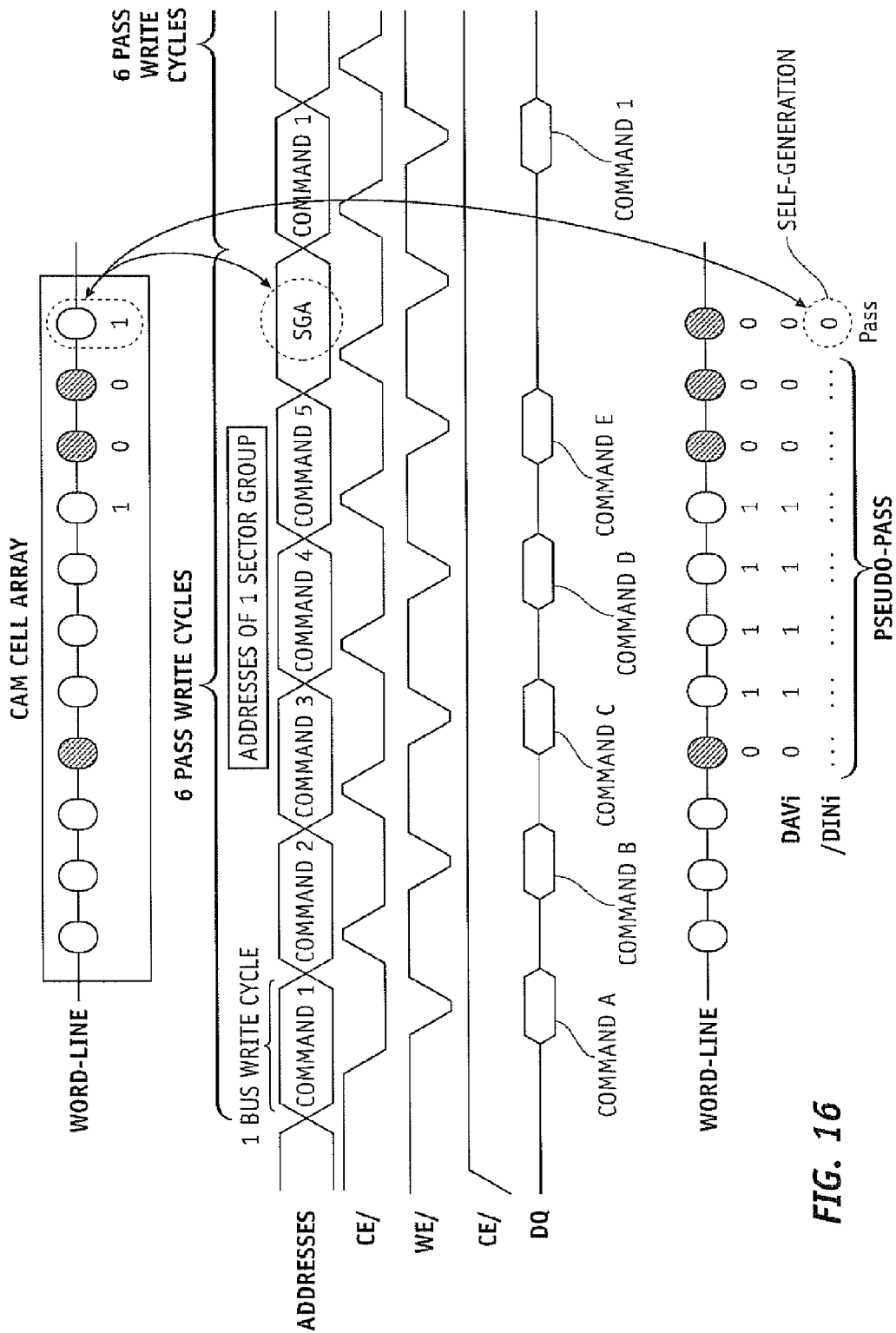
FIG. 16 illustrates the procedures to be carried out by the verification circuit in the address mode in accordance with the second embodiment of the present invention.

Referring now to the flowchart of FIG. 15 and the diagrams of FIG. 16, the operation to be performed in a case where a sector group address (SGA) is designated from the outside is described. As shown in FIG. 16, in accordance with the sequence for executing the program command of a WP-CAM cell, the procedures for command recognition are carried out in five cycles, and information is rewritten in the sixth cycle.

In short, a SGA to be programmed is designated, and programming of the SGA is performed in six cycles in total.

First, a WP-CAM address designating signal for designating a WP-CAM cell to be programmed is input. The WP-CAM address designating signal is analyzed by the decoder (step S20), so as to generate an address corresponding to the WP-CAM cell to be actually programmed. In the verification circuit 13, the WP-CAM address designating signal is also decoded by the decoder 51 and a high-level verification control signal is output to the expected value holding circuit 32 and the data comparator circuit 34 corresponding to the WP-CAM cell to be programmed. A low-level verification control signal is output to the other expected value holding circuits 32 and the other data comparator circuits 34.

Next, the data that is already stored in the WP-CAM cell designated from the decoding result is pre-read (step S21). The pre-read data is analyzed to determine the data write state of the WP-CAM cell.

If the WP-CAM cell is determined to be in an erased state ("YES" in step S22), data is written in the WP-CAM cell and it is put into a programmed state (step S23). If the WP-CAM cell is determined to be in a programmed state ("NO" in step S22), the operation comes to an end.

When the programming of the WP-CAM cell is finished, verification to determine whether the data has indeed been written in the WP-CAM cell is performed by the verification circuit 13.

The WP bit select circuit 33 and the data comparator circuits 34-(0) through 34-(15) provided for the respective I/Os are connected with lines, and a verification control signal are output from the WP bit select circuit 33. In the address mode, the switches 35-(0) through 35-(15) are turned ON by the interface mode setting signal. Accordingly, the verification control signal is input only to the expected value holding circuit 32 connected to the line through which a "H"-level verification control signal is output. The expected value holding circuit 32 to which the "H"-level verification control signal is input generates the expected value "0" indicating that the subject WP-CAM cell is programmed and outputs the expected value "0" to the data comparator circuit 34 (step S24) (see FIG. 16). The other expected value holding circuits 32 to which a "L"-level verification control signal is input do not generate an expected value (step S24). Accordingly, an expected value is not output to the data comparator circuits 34.

The data comparator circuit 34 to which the expected value "0" is input from the expected value holding circuit 32 reads the data from the corresponding WP-CAM cell and compares the data DAVi with the expected value "0" (denoted by/DINi in FIG. 16). Receiving the low-level verification control signal, the other data comparator circuits 34 forcibly output "H"-level matching signals. In short, a pseudo verification pass is performed (see FIG. 16).

When all the matching signals output from the data comparator circuits 34 are at the "H" level, the determining circuit 12 outputs a verification signal indicating data write success to the controller (step S25). The data comparison result of the actually programmed WP-CAM cell can be output as the verification result.

Figure 17:
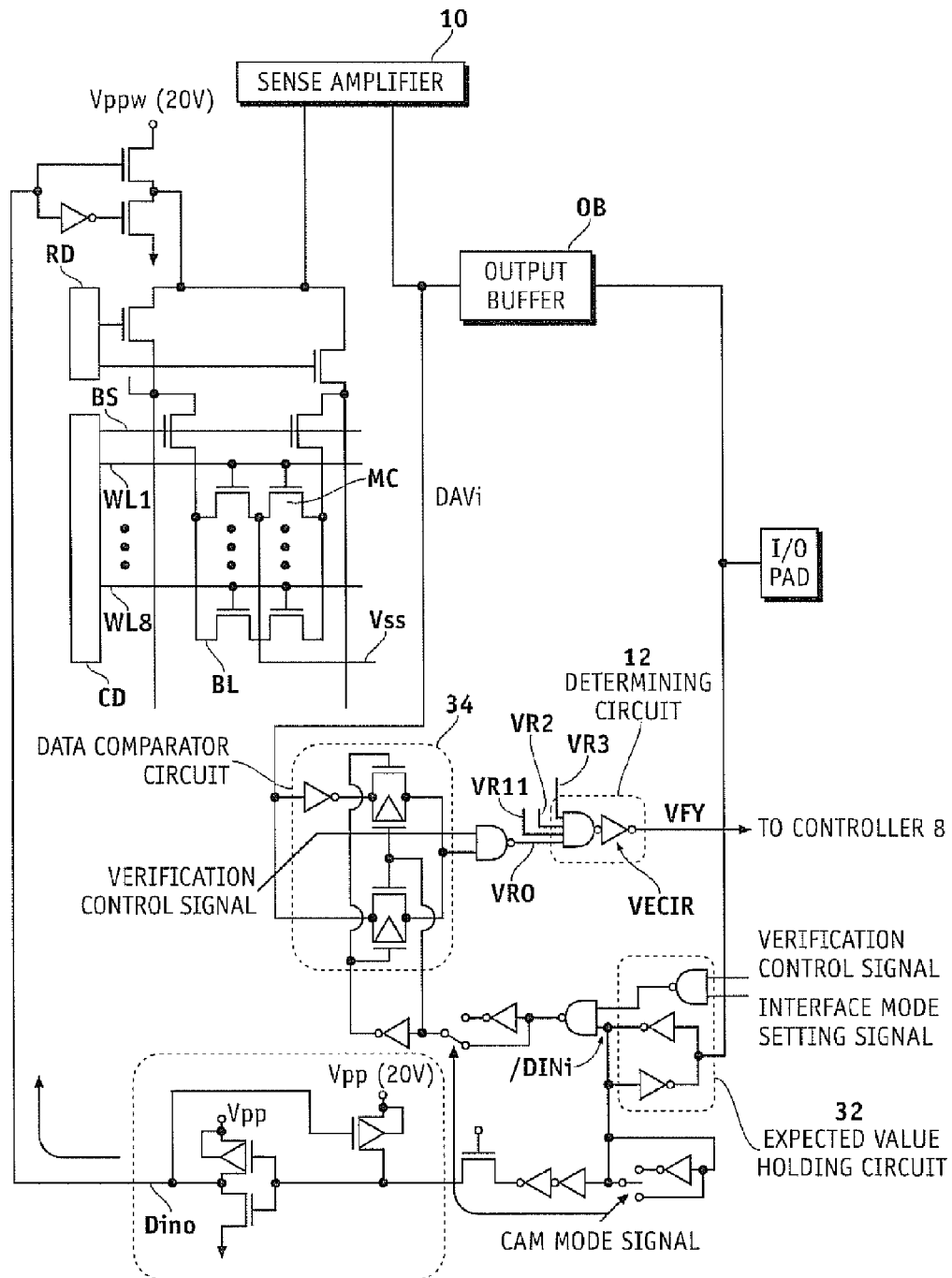
FIG. 17 illustrates, in greater detail, the structure of the verification circuit in accordance with the second embodiment of the present invention.

FIG. 17 illustrates the structures of each expected value holding circuit 32 and each data comparator circuit 34 shown in FIG. 11, and the structure of the determining circuit 12. As described above, the output of each data comparator circuit 34 is controlled by the verification control signal from the WP bit select circuit 33, and is output to the determining circuit 12. Also, each data comparator circuit 34 is controlled by a CAM mode signal for rewriting a CAM cell. Further, each expected value holding circuit 32 is controlled by the interface mode setting signal.

Third Embodiment

Figure 18:
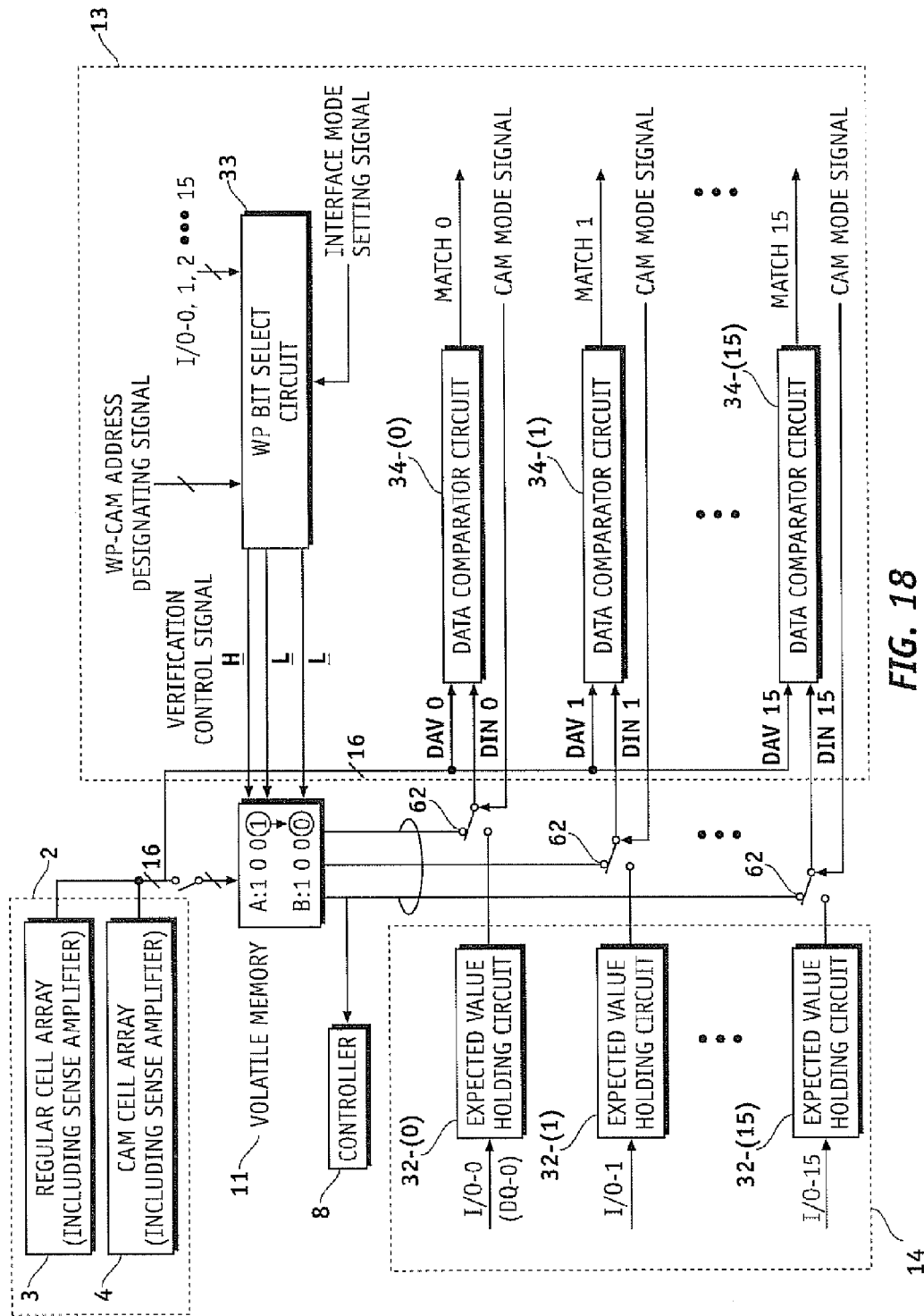
FIG. 18 illustrates the structures of a cell array and a verification circuit in accordance with a third embodiment of the present invention.

Referring now to FIG. 18, a third embodiment of the present invention is described. The CAM data that is written in a CAM cell array 4 is read by switching ON a switch 61 at the time of power supply or resetting the hardware. The CAM data is then transferred to a volatile memory 11 such as a SRAM as shown in FIG. 18. The CAM data is read out from the volatile memory 11 so that read access to a regular cell array 3 is not delayed. In this embodiment, when programming is performed on the CAMs, the data stored in the volatile memory 11 is used as expected value data, and data comparator circuits 34 compare the expected value data with the data that is read out from the CAM cell.

Other than the time at which verification is performed on the data that is programmed in the CAM cell array 4, a switch 62 is switched by a CAM mode signal so as to connect the expected value holding circuits 32 to the data comparator circuits 34. By doing so, verification using the expected value holding circuits 32 can be performed at the time of verifying the regular cell array 3.

Figure 19:
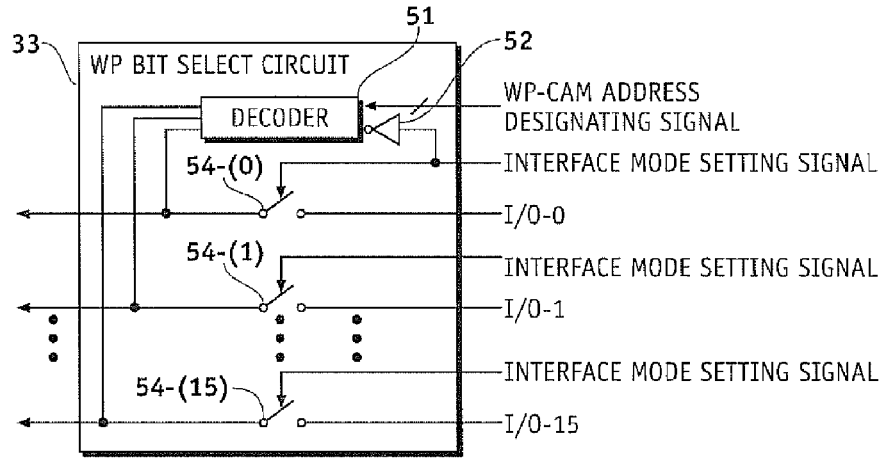
FIG. 19 illustrates the structure of a WP bit select circuit in accordance with the third embodiment of the present invention.

FIG. 19 illustrates the structure of the WP bit select circuit 33. In this embodiment, the AND gates 53 of the second embodiment are not employed. When the I/O mode is set by the interface mode setting signal, the I/O-input signals I/O (0), (1), . . . , (15) are output without change as verification control signals. In the address mode, the switches 54-(0) through 54-(15) are turned OFF, and a decoded signal is output from the decoder 51. When the address mode is set, a WP-CAM address designating signal is input to the decoder 51, which then analyzes the signal so as to determine the WP-CAM cell designated by the program. A high-level verification control signal indicating that the WP-CAM cell is designated by the programming is output to the volatile memory 11. The verification control signals that are output from the other WP-CAM cells (the WP-CAM cells that are not designated by the programming) are at the low level.

In the volatile memory 11, there are two memory regions that hold the data read out from CAM cells. A first memory region is a region holding the data that is proved to indeed be stored in the CAM cells through verification. In other words, the first memory region holds data equivalent to the nonvolatile memory information in the CAM cell array 4 after the programming (including verification) in the CAM cells. Accordingly, when there is a request for the data of the CAM cells from a circuit required for operations at the time of a regular operation of the regular cell array 3, the data stored in the first memory region is output. A second memory region is a region that is used as a temporary memory area and holds the data of CAM cells pre-read at the time of programming.

Receiving a verification control signal from the WP bit select circuit 33, the volatile memory 11 outputs "0" as the expected value of the WP-CAM cell designated by the verification control signal, as shown in FIG. 18, instead of the data that is read in at the time of pre-reading. The volatile memory 11 also outputs (initial pass) the data stored in the second memory region at the time of pre-reading as the data of the other WP-CAM cells corresponding to low-level verification control signals.

Figure 21:
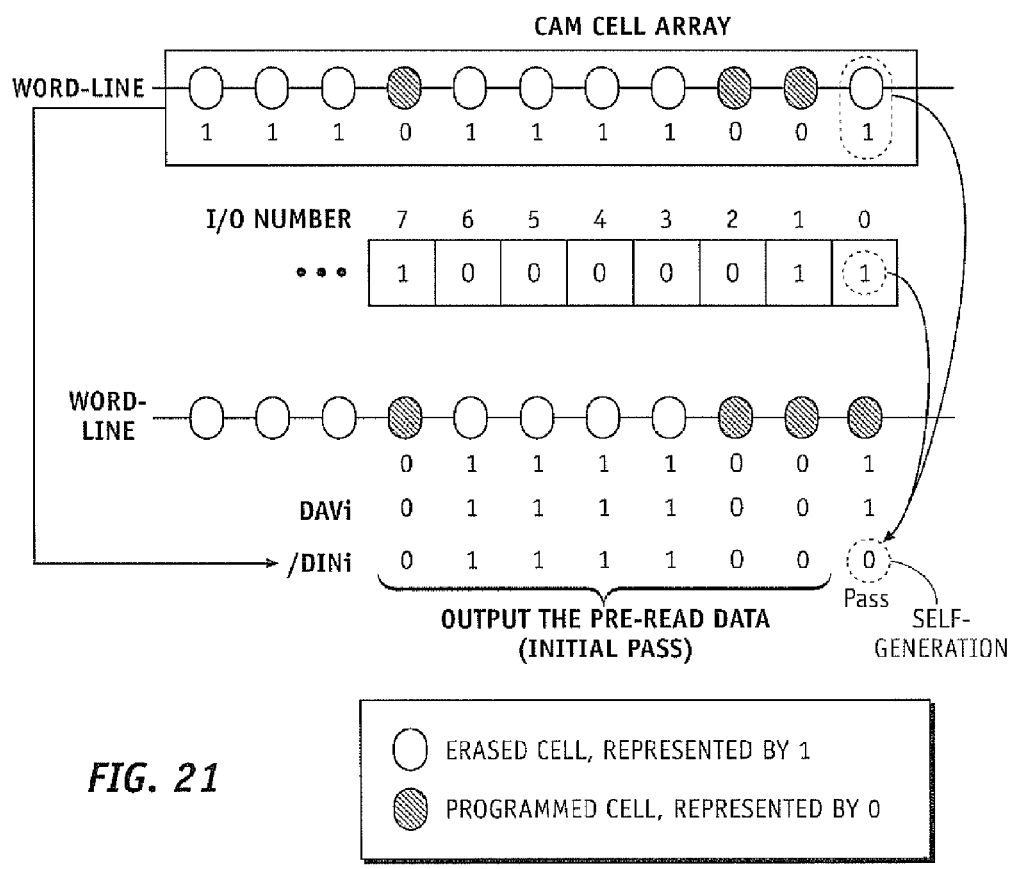
FIG. 21 illustrates the procedures to be carried out by the verification circuit in the I/O mode in accordance with the third embodiment of the present invention.
Figure 20:
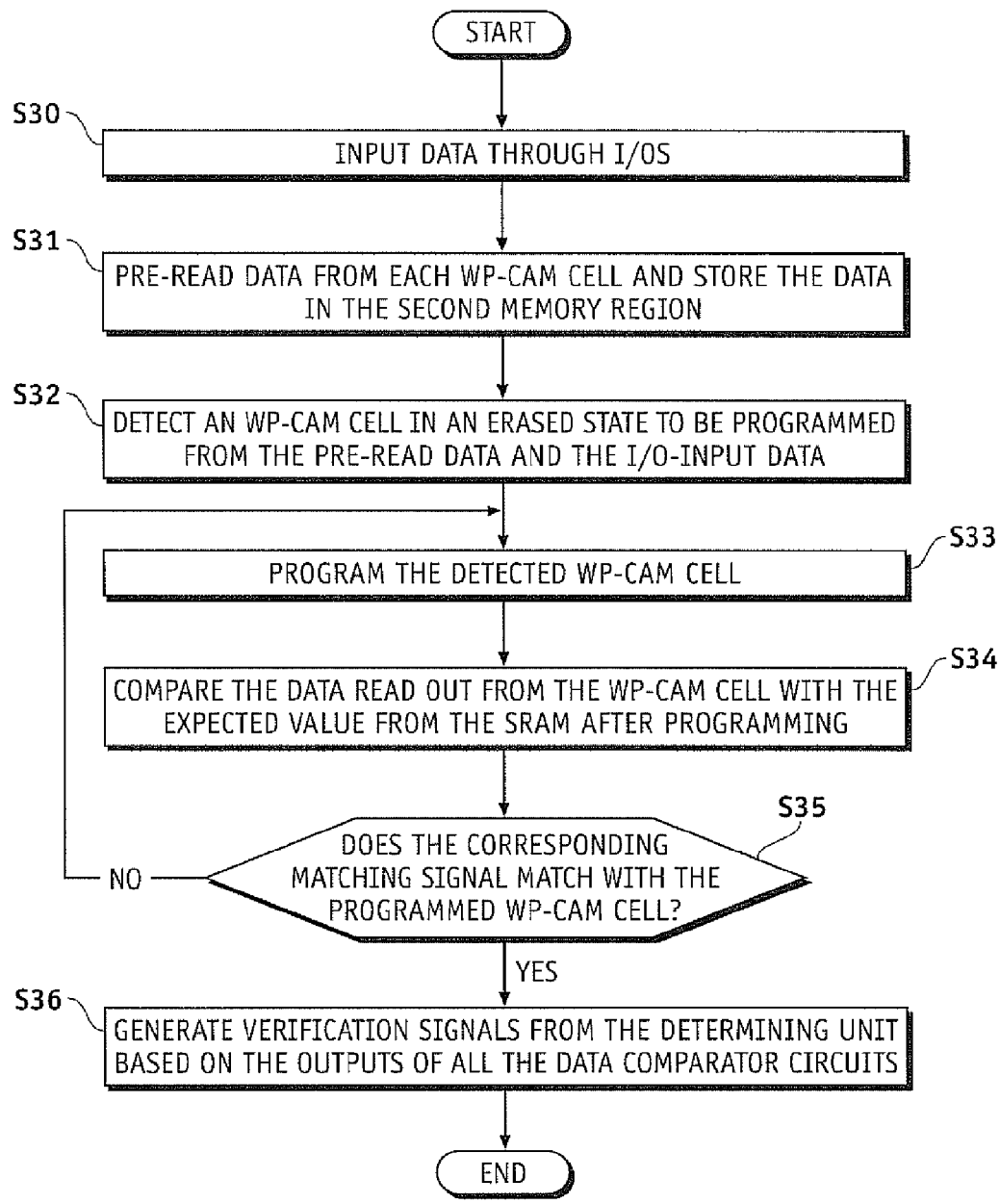
FIG. 20 is a flowchart of the operation of the verification circuit in the I/O mode in accordance with the third embodiment of the present invention.

Referring now to the flowchart of FIG. 20 and the illustration of FIG. 21, the operation of programming the CAM cell array 4 set in the I/O mode in accordance with this third embodiment is described. First, CAM program setting signals (I/O-0 through I/O-15) for designating a WP-CAM cell to be programmed are input from the respective I/Os (step S30). The information "1" for commanding programming is input to the I/O corresponding to the WP-CAM cell to be programmed and the information "0" is input to the other I/Os.

The data is then pre-read from the WP-CAM cells, and the data write state of each WP-CAM cell is determined (step S31). If a WP-CAM cell is in a programmed state with written data, the information "0" should be stored in the WP-CAM cell. If a WP-CAM cell is in an erased state without written data, the information "1" should be written in the WP-CAM cell.

Next, the WP-CAM cell that is currently in an erased state and in which write is allowed by an I/O input signal is detected (step S32). More specifically, the WP-CAM cell having the pre-read data of "1" indicating an erased state and the I/O input of "1" is detected. In a case where the WP-CAM cell designated for programming has already been programmed, the operation comes to an end, and an error signal is output. The procedures described so far are carried out by the controller 8.

Programming is performed on the detected WP-CAM cell (step S33). As the programming is performed, the verification circuit 13 determines whether the data has definitely been written in the WP-CAM cell. At this point, the switches 54-(0) through 54-(15) provided for the I/Os are turned ON by the interface mode setting signal. The decoder 51 stops the operation upon receipt of the interface mode setting signal that is input via the inverter 52.

The WP bit select circuit 33 outputs the input signals I/O-(0) through I/O-(15) as verification control signals to the volatile memory 11 as they are. More specifically, as "1" is I/O-input to the WP-CAM cell designated by the program, the WP-bit select circuit 33 outputs a high-level signal as the verification control signal. The verification control signals corresponding to the other WP-CAM cells are at the low level.

The volatile memory 11 outputs the expected value "0" as the data of the WP-CAM cell designated by the high-level verification signal to the data comparator circuit 34 (see FIG. 21). The pre-read data stored in the second memory region are output as the expected value data of the other WP-CAM cells (see FIG. 21).

The data comparator circuits 34-(0) through 34-(15) compare the data read from the WP-CAM cells after programming with the expected values read from the volatile memory 11 (step S34). Since the data read from an unprogrammed WP-CAM cell is always the same as the expected value of the WP-CAM cell, verification is performed by determining whether the data of each programmed WP-CAM is equal to the expected value. If the data read from the WP-CAM cell is not equal to the expected value ("NO" in step S35), the operation returns to the programming procedure (step S33). If the data read from the WP-CAM cell is equal to the expected value ("YES" in step S35), a matching signal indicating the matching between the data and the expected value is output from the data comparator circuit 34 to the determining circuit 12. If all the matching signals from the data comparator circuits 34 indicate the matching, the determining circuit 12 outputs a verification pass signal to the controller (step S36). If the verification succeeds, the data is read from the WP-CAM cell or the sense amplifier, and is stored as the authorized data of the WP-CAM cell in the first memory region of the volatile memory 11 (step S37).

In this embodiment, operation is controlled so as to perform a pseudo pass on the comparison results of the data comparator circuits allocated to the unprogrammed CAM cells. Accordingly, the programming result of the programmed CAM cell can be reflected in the verification.

Figure 22:
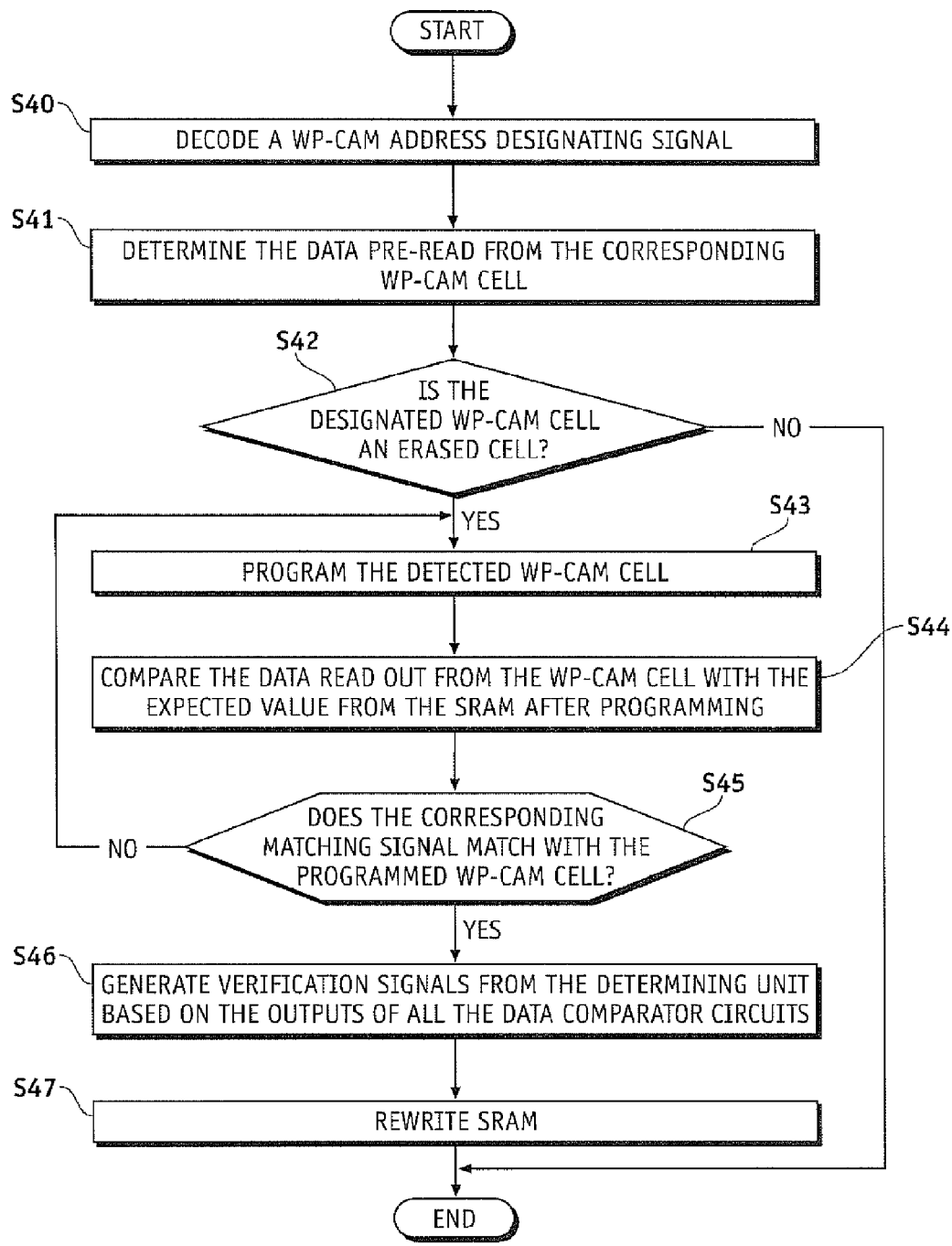
FIG. 22 is a flowchart of the operation of the verification circuit in the address mode in accordance with the third embodiment of the present invention.
Figure 23:
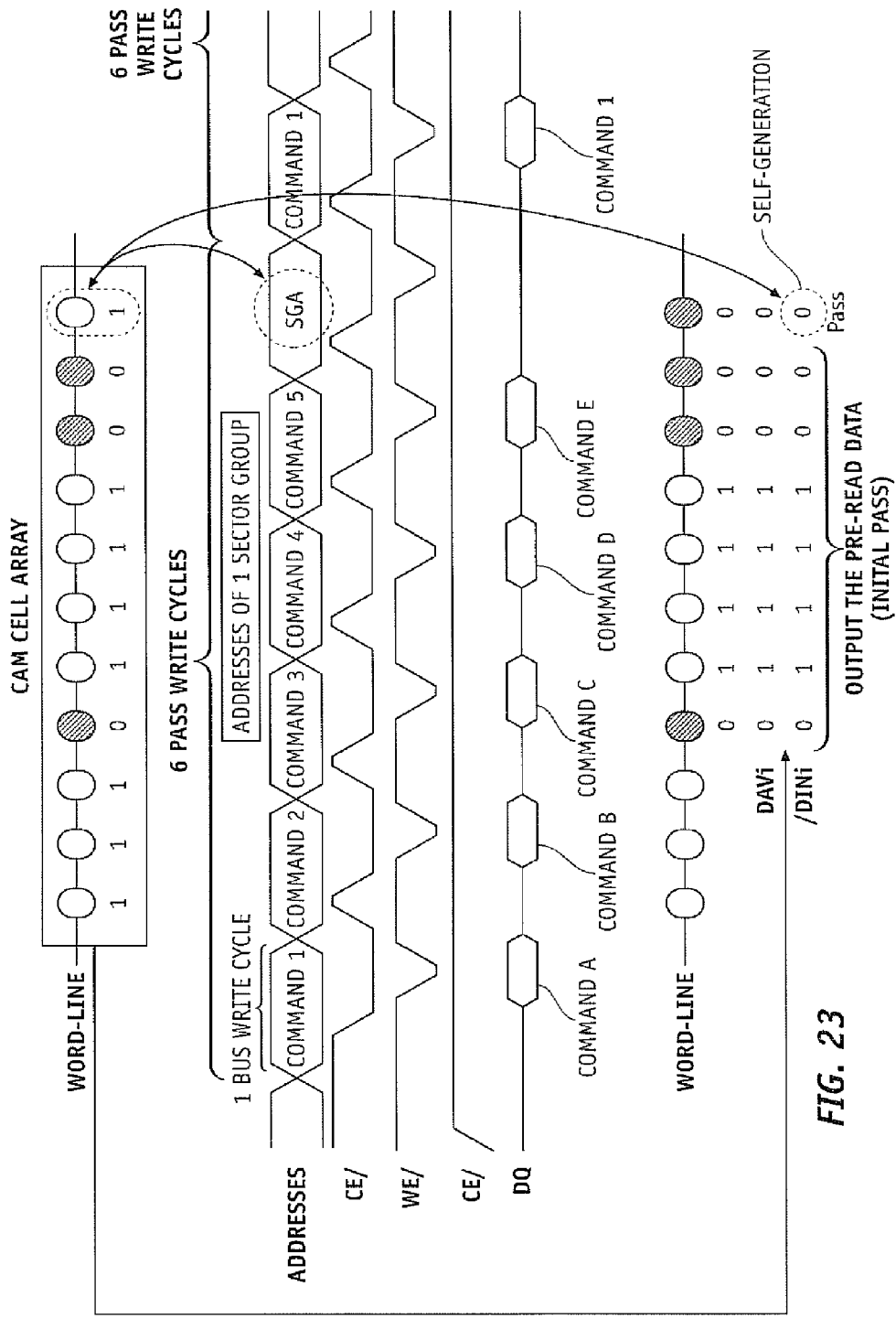
FIG. 23 illustrates the procedures to be carried out by the verification circuit in the address mode in accordance with the third embodiment of the present invention.

Referring now to the flowchart of FIG. 22 and the diagrams of FIG. 23, the operation to be performed in the address mode is described. First, a WP-CAM address designating signal for designating a WP-CAM cell to be programmed is input. The WP-CAM address designating signal is analyzed by a decoder (step S40), so as to generate an address representing the WP-CAM cell to be actually programmed. In the verification circuit 13, the WP-CAM address designating signal is decoded by the decoder 51. A verification control signal for designating the WP-CAM cell to be programmed is then output to the volatile memory 11.

Next, the data that has already been stored in the WP-CAM cell selected by the decoding result is read out through pre-reading (step S41). Using the pre-read data, the data write state of the WP-CAM cell is determined.

If the WP-CAM cell is determined to be in an erased state ("YES" in step S42), data is written in the WP-CAM cell, which is thus put into a programmed state (step S43). If the WP-CAM cell is determined to be in a programmed state ("NO" in step S42), the operation comes to an end.

Thereafter, programming and verification are performed on the detected WP-CAM cell in the same manner as in the flowchart shown in FIG. 20. At the time of verification, the volatile memory 11 outputs the expected value "0" as the data of the WP-CAM cell designated by the high-level verification control signal to the data comparator circuit 34 (see FIG. 23). The pre-read data stored in the second memory region are output as the expected value data of the other WP-CAM cells (see FIG. 23). The data comparator circuits 34-(0) through 34-(15) compare the data read from the WP-CAM cells after programming with the expected values read from the volatile memory 11 (step S44). If the data read from a WP-CAM cell after programming is equal to the expected value of the WP-CAM ("YES" in step S45), a verification pass signal is output to the controller 8 (step S46). If the data read from a WP-CAM cell after programming is not equal to the expected value of the WP-CAM ("NO" in step S45), processing returns to program the WP-CAM cell (step S43). If the verification succeeds, the data is read from the WP-CAM cell or the sense amplifier, and is stored as the proper data of the WP-CAM cell in the first memory region of the volatile memory 11 (step S47).

Figure 24:
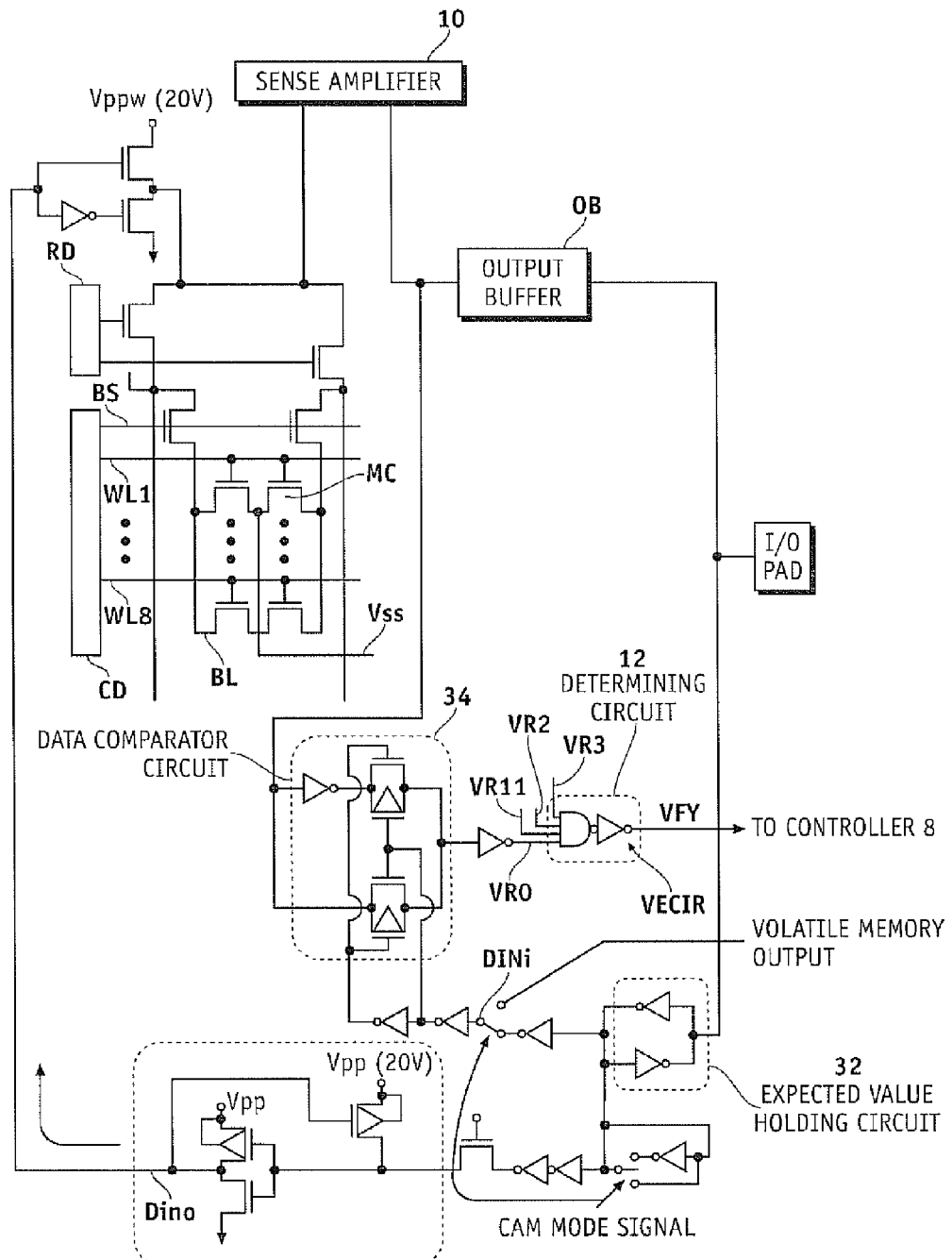
FIG. 24 illustrates, in greater detail, the structure of the verification circuit in accordance with the third embodiment of the present invention.

FIG. 24 illustrates the structure of the verification circuit of the semiconductor device in detail. In the verification circuit shown in FIG. 24, the inputs to each data comparator circuit 34 are switched by a CAM mode signal. More specifically, in a CAM mode, the output of the volatile memory 11 is input to each data comparator circuit 34. In a regular operation, the outputs of the expected value holding circuits 32 are input to the data comparator circuits 34.

The above described embodiments are preferred embodiments of the present invention. However, the present invention is not limited to these embodiments, and various changes and modifications can be made without departing from the scope of the present invention.

For example, the volatile memory 11 may be formed with only one memory region (the first memory region). The CAM data written in the CAM cell array 4 is read by switching the switch 61 at the time of power supply or resetting the hardware. Through pre-reading, the WP-CAM cell having the data of "1" indicating an erased state and the I/O input of "1" is detected by reading the information from the volatile memory 11. Programming is then performed on the detected WP-CAM cell. As the programming is performed, the verification circuit 13 performs verification to determine whether the data has definitely been written in the WP-CAM cell. The WP bit select circuit 33 outputs a high-level signal as a verification control signal to the WP-CAM cell designated by the programming, and outputs low-level signals as the verification control signals to the other WP-CAM cells. The volatile memory 11 outputs the expected value "0" to the data comparator circuits 34, regardless of the information stored as the data of the WP-CAM cell designated by the high-level verification control signal in the readout portion (not shown) of the first memory region. More simply, a clamp circuit that uses a verification control signal is attached to the readout portion of the first memory region, so as to clamp the outputs to "0". The information stored in the first memory region is output as the expected value data of the other WP-CAM cells without an operation of the clamp circuit. The data comparator circuits compare the data read from a WP-CAM cell after programming with the expected value read from the volatile memory 11. If the verification result indicates "matching", the data read from the WP-CAM cell or the sense amplifier by switching on the switch 61, and are stored as the proper data of the WP-CAM cell.

The device components of the volatile memory 11 may include a so-called static memory cell, or may be a latch circuit that is formed with logic elements applied to the peripheral circuits.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of allocating addresses to a cell array that stores operation setting information for a semiconductor device, the method comprising the step of:
    allocating different row addresses to respective functions of the operation setting information wherein the operation setting information is allocated to column addresses selected by one of the row addresses.

2. The method as claimed in claim 1, further comprising the step of:
    allocating different column addresses for the respective functions of the operation setting information.

3. The method as claimed in claim 1, further comprising the step of:
    allocating continuous column addresses for the respective functions of the operation setting information.

4. The method as claimed in claim 3, further comprising the step of:
    selecting all word lines on the cell array and successively changing the column addresses to read data from the cell array.

5. A method of allocating addresses, comprising:
    providing a memory cell array that stores operation setting information for a semiconductor device; and
    allocating different row addresses to respective functions of the operation setting information wherein the operation setting information is allocated to column addresses selected by one of the row addresses.

6. The method as claimed in claim 5, further comprising the step of:
    allocating different column addresses for the respective functions of the operation setting information.

7. The method as claimed in claim 5, further comprising the step of:
    allocating continuous column addresses for the respective functions of the operation setting information.

8. The method as claimed in claim 7, further comprising the step of:
    selecting all word lines on the cell array and successively changing the column addresses to read data from the cell array.

9. A method of allocating addresses to a cell array that stores operation setting information for a semiconductor device, the method comprising the step of:
    allocating different row addresses to respective functions of the operation setting information;
    allocating operation setting information to column addresses selected by one of the row addresses; and
    reading out data with column addresses for respective functions of the operation setting information.

10. The method as claimed in claim 9, further comprising the step of:
    allocating different column addresses for the respective functions of the operation setting information.

11. The method as claimed in claim 9, further comprising the step of:
    allocating continuous column addresses for the respective functions of the operation setting information.

12. The method as claimed in claim 11, further comprising the step of:
    selecting all word lines on the cell array and successively changing the column addresses to read data from the cell array.

* * * * *